(12) United States Patent
Merminod et al.

(10) Patent No.: US 11,625,159 B2
(45) Date of Patent: *Apr. 11, 2023

(54) INPUT DEVICE INCLUDING A RATCHET SYSTEM WITH AN ELECTROMAGNETIC ACTUATOR

(71) Applicant: Logitech Europe S.A., Lausanne (CH)

(72) Inventors: Baptiste Merminod, Dommartin (CH); Davin O'Mahony, Dublin (IE); Antoine Merminod, Gimel (CH)

(73) Assignee: Logitech Europe S.A., Lausanne (CH)

( * ) Notice: Subject to any disclaimer, the term of this patent is extended or adjusted under 35 U.S.C. 154(b) by 0 days.

This patent is subject to a terminal disclaimer.

(21) Appl. No.: 16/844,897

(22) Filed: Apr. 9, 2020

(65) Prior Publication Data

US 2020/0341626 A1    Oct. 29, 2020

Related U.S. Application Data

(63) Continuation of application No. 15/460,005, filed on Mar. 15, 2017, now Pat. No. 10,642,467.

(Continued)

(51) Int. Cl.
*G06F 3/04847* (2022.01)
*G06F 3/0362* (2013.01)
(Continued)

(52) U.S. Cl.
CPC .......... *G06F 3/04847* (2013.01); *G05G 1/10* (2013.01); *G05G 5/03* (2013.01); *G05G 5/06* (2013.01); *G06F 3/02* (2013.01); *G06F 3/021* (2013.01); *G06F 3/0213* (2013.01); *G06F 3/038* (2013.01); *G06F 3/0362* (2013.01);
(Continued)

(58) Field of Classification Search
CPC ........ G06F 3/04847; G06F 3/02; G06F 3/021; G06F 3/0213; G06F 3/0362; G06F 3/038; G06F 3/0383; G05G 1/10; G05G 5/03; G05G 5/06; H03K 17/96
See application file for complete search history.

(56) References Cited

U.S. PATENT DOCUMENTS 10,061,276 B2 *   8/2018   Funakubo ............... H02P 23/12
2006/0001657 A1 * 1/2006   Monney ............. G06F 3/03543
                                                                    345/184

(Continued)

*Primary Examiner* — Fred Tzeng
(74) *Attorney, Agent, or Firm* — Kilpatrick Townsend & Stockton LLP

(57) ABSTRACT

In certain embodiments, an electronic input device includes a knob assembly defining an annular cavity and including a magnetically attractable armature. The electronic input device also includes a ratchet assembly disposed within the annular cavity and includes a ring magnet. The electronic input device includes a clutch mechanism that has a friction disc assembly, and an electromagnet configured to generate a magnetic field that shifts the friction disc assembly between a first position in which the friction disc assembly prevents rotation of the ratchet assembly and a second position in which the ratchet assembly is free to rotate with the knob assembly. The ring magnet of the ratchet assembly interacts with the magnetically attractable armature to generate a ratcheting feedback in response to rotation of the knob assembly when the friction disc assembly is in the first position.

13 Claims, 23 Drawing Sheets

Related U.S. Application Data

(60) Provisional application No. 62/433,187, filed on Dec. 12, 2016.

(51) Int. Cl.
    *G06F 3/02*         (2006.01)
    *G06F 3/038*       (2013.01)
    *G05G 5/06*        (2006.01)
    *G05G 1/10*        (2006.01)
    *G05G 5/03*        (2008.04)
    *H03K 17/96*      (2006.01)
    *G05G 1/02*        (2006.01)
    *H01H 3/00*        (2006.01)
    *G05G 1/08*        (2006.01)
    *G06F 3/041*       (2006.01)
    *H01H 19/14*      (2006.01)

(52) U.S. Cl.
CPC ........... *G06F 3/0383* (2013.01); *H03K 17/96* (2013.01); *G05G 1/02* (2013.01); *G05G 1/08* (2013.01); *G06F 3/041* (2013.01); *G06F 2203/04104* (2013.01); *H01H 19/14* (2013.01); *H01H 2003/008* (2013.01); *H01H 2235/01* (2013.01); *H01H 2300/038* (2013.01)

(56) References Cited

U.S. PATENT DOCUMENTS

| | | | |
|---|---|---|---|
| 2007/0200208 A1* | 8/2007 | Wang | F16H 55/17 257/668 |
| 2008/0018288 A1* | 1/2008 | Malrait | H02P 21/16 318/721 |
| 2009/0015360 A1* | 1/2009 | North | G05G 5/06 335/209 |
| 2010/0176679 A1* | 7/2010 | Ichiyama | H02K 21/38 310/156.35 |
| 2010/0201294 A1* | 8/2010 | Yuuki | B60L 15/025 318/400.3 |
| 2011/0025311 A1* | 2/2011 | Chauvin | G01D 5/145 324/207.25 |
| 2011/0219895 A1* | 9/2011 | Sano | B60Q 1/1476 74/412 R |
| 2012/0268046 A1* | 10/2012 | Yamazaki | H02P 21/26 318/400.02 |
| 2013/0320897 A1* | 12/2013 | Hirono | H02P 6/182 318/400.34 |
| 2014/0054986 A1* | 2/2014 | Hirai | H02P 29/662 310/53 |
| 2014/0361646 A1* | 12/2014 | Saito | B60L 15/20 310/51 |
| 2015/0002063 A1* | 1/2015 | Fahimi | H02K 21/22 318/400.15 |
| 2018/0164900 A1* | 6/2018 | Merminod | G06F 3/04847 |
| 2018/0214730 A1* | 8/2018 | Larose | A63B 21/158 |
| 2020/0174512 A1* | 6/2020 | Battlogg | G05G 5/03 |

\* cited by examiner

INPUT DEVICE INCLUDING A RATCHET SYSTEM WITH AN ELECTROMAGNETIC ACTUATOR

CROSS-REFERENCE TO RELATED APPLICATIONS

This application is a continuation of Ser. No. 15/460,005, filed Mar. 15, 2017, and entitled, "INPUT DEVICE INCLUDING A RATCHET SYSTEM WITH AN ELECTROMAGNETIC ACTUATOR", which claims priority to U.S. Provisional Patent Application No. 62/433,187, filed Dec. 12, 2016, and entitled "CONTEXTUALLY-BASED FUNCTIONAL ASSIGNMENT FOR A USER-MANIPULABLE ELEMENT ON AN INPUT DEVICE", which is herein incorporated by reference in its entirety and for all purposes.

BACKGROUND

Peripheral devices generally include any auxiliary device that can be used to interface with humans and computers. Some common peripheral devices include keyboards, computer mice, image scanners, speakers, microphones, web cameras, and more.

Keyboards and computer mice, in particular, have improved in function and performance over the last few decades to increase user productivity. For instance, the advent of function keys, key pads, programmable hot keys, scroll wheels, and the like, have helped users become more efficient by placing commonly used functions in quickly accessible locations. However, despite these improvements, more powerful, feature-laden software (e.g., professional graphic design, photography and video editing software) still requires users to navigate cumbersome and sometimes non-intuitive interfaces with nested menus and windows that still can make for highly inefficient work-sessions, especially for software users that are not highly experienced or steeped in the particular software. New developments are needed to improve the user interface, streamline workflow, and increase work efficiencies across a broad spectrum of applications.

SUMMARY

In certain embodiments, an electronic input device includes a knob assembly defining an annular cavity and comprising a magnetically attractable armature; a ratchet assembly disposed within the annular cavity and comprising a ring magnet; and a clutch mechanism, comprising: a friction disc assembly, and an electromagnet configured to generate a magnetic field that shifts the friction disc assembly between a first position in which the friction disc assembly engages the ratchet assembly and a second position in which the friction disc assembly is disengaged from the ratchet assembly. The ring magnet interacts with the magnetically attractable armature to generate a ratcheting feedback in response to rotation of the knob assembly when the friction disc assembly is in the first position.

A primary means of input for the electronic input device is rotation of the knob assembly about an axis of rotation that extends through an opening defined by the ring magnet.

In certain embodiments, an electronic input device includes a ratchet assembly comprising a first ring magnet; a friction disc assembly movable between a first position and a second position, the friction disc assembly engaging the ratchet assembly when the friction disc assembly is in the first position and disengaging from the ratchet assembly when the friction disc assembly moves towards the second position; a spring applying a first force that biases the friction disc assembly towards the first position; a second ring magnet emitting a first magnetic field that generates a second force that biases the friction disc assembly towards the second position; an electromagnetic actuator configured to emit a second magnetic field that reduces the magnitude of the second force when current is applied to the electromagnetic actuator in a first direction and increases the magnitude of the second force when current is applied to the electromagnetic actuator in a second direction; and a knob enclosing the ratchet assembly, the friction disc assembly, the spring, the second ring magnet and the electromagnetic actuator within an annular cavity.

The friction disc assembly can include a friction disc and a clutch control armature coupled to the friction disc. The clutch control armature completes a magnetic circuit when the friction disc assembly is in the second position. When the friction disc assembly is in the first position, a roughened surface of the friction disc interacts with a surface of the ratchet assembly to oppose rotation of the ratchet assembly.

In certain embodiments, an electronic input device includes a ratchet assembly, comprising a first armature having a first set of radially protruding teeth, a second armature having a second set of radially protruding teeth, the first set of teeth being aligned with the second set of teeth, and a ring magnet disposed between the first armature and the second armature and emitting a magnetic field; and a knob assembly, comprising: a knob enclosing the ratchet assembly within an annular cavity, and an armature ring coupled to an interior facing surface of the knob and including a set of axially protruding teeth, the magnetic field establishing magnetic circuits that flow through the first and second armatures and each of the axially protruding teeth. The magnetic flux flowing through the magnetic circuits generates resistance to rotation of the knob assembly.

BRIEF DESCRIPTION OF THE DRAWINGS

The detailed description is set forth with reference to the accompanying figures.

DETAILED DESCRIPTION

Figure 1:
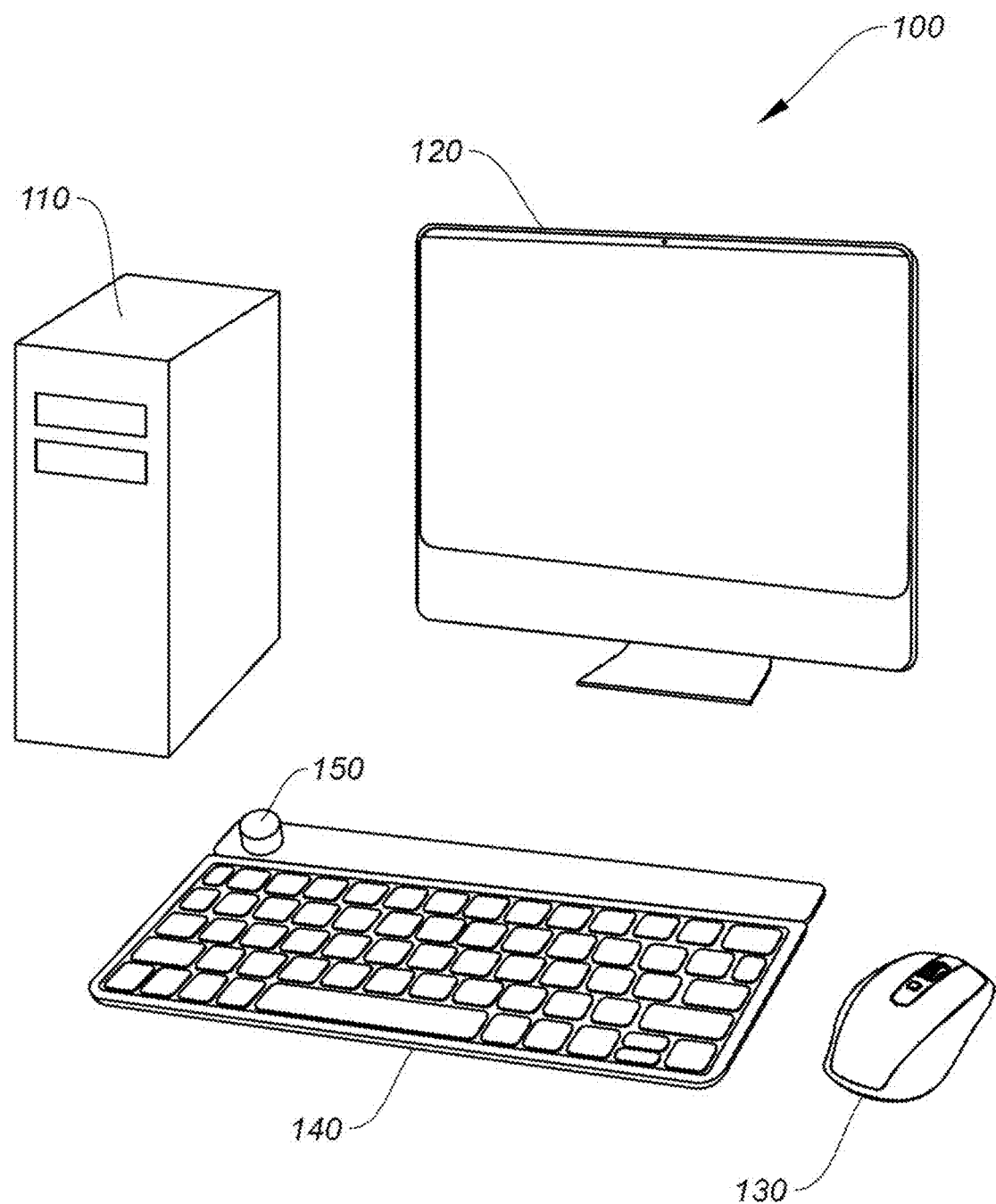
FIG. 1 shows a typical implementation for a system utilizing a contextually-based functional assignment for a user-manipulable element on an input device, according to certain embodiments.

Aspects of the present disclosure relate generally to input devices, and in particular to aspects of assigning a function to a user-manipulable object on an input device, according to certain embodiments.

In the following description, various embodiments of assigning a function to a user-manipulable object on an input device will be described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

Conceptual Overview of Certain Embodiments

Some embodiments of the invention relate to a user-manipulable element (e.g., a knob) disposed on an input device (e.g., keyboard) that can be assigned a function based on a contextual interaction on a graphical user interface (GUI). More specifically, the input device may include a user-manipulable knob (see, e.g., element 150 of FIG. 1), a ratchet system disposed in the knob to apply a ratcheted or non-ratcheted mode, and one or more touch-sensitive sensors ("touch sensor(s)") disposed on a surface of the knob.

An operational configuration can be applied to the knob which may control one or more aspects of knob rotation, knob rotation resolution, knob rotation resistance (e.g., torque friction), knob ratchet/non-ratchet modes, touch-based functions, and the like, as further discussed below. The operational configuration can be based on a contextual usage of the input device. For example, selecting alphanumeric text on a display may cause the knob to control functions associated with alphanumeric text, such as font size, font type, font color, font position, and the like, as further discussed below.

The input device can be controlled by a host computing device. For instance, one or more processors of the host computing device can detect a selectable control element on a GUI (e.g., alphanumeric text), determine an editable parameter (e.g., font size) associated with the selectable control element, and associate a control of the editable parameter with a user-manipulable element on an input device. The one or more processors can further generate and send control data causing the input device (e.g., a processor of the input device) to assign a performance characteristic to the knob based on properties of the editable parameter. As discussed above, the performance characteristic may include a rotation resistance of the knob, a rotational input resolution of the knob (e.g., rotation sensitivity), a setting of a ratchet or non-ratchet mode of operation to the knob based on the properties of the editable parameter, a function of one or more touch sensors on the knob, or a depressible function (e.g., button press). In some aspects, the control data can control an electro-magnetic actuator (e.g., clutch) in the control knob to set the ratchet mode and non-ratchet mode of operation. In certain configurations, the touch sensor(s) may enter a value (e.g., controlled by rotating the knob) in response to receiving input data corresponding to a touch detected by the touch sensor, or switch to a second editable parameter associated with the selectable control element in response to the input data.

Typical System Environment for Certain Embodiments

FIG. 1 shows a typical implementation for a system 100 utilizing a contextually-based functional assignment for a user-manipulable element 150 on an input device 140, according to certain embodiments. System 100 may include computer 110, display 120, input device 130 (e.g., "computer mouse 130"), and input device 140 (e.g., "keyboard 140"). Keyboard 140 can include a user-manipulable element 150 ("knob 150"). For system 100, input device 130 and keyboard 140 can be configured to control aspects of computer 110 and display 120, as would be understood by one of ordinary skill in the art. Computer 110 can be referred to as a "host computer" or a "host computing device."

Computer 110 may include a machine readable medium (not shown) that is configured to store computer code, such as keyboard driver software, and the like, where the computer code is executable by a processor (e.g., processor(s) 302) of computer 110 to affect control of computer 110 by input devices 130 and/or 140. The various embodiments described herein generally refer to input device 140 as a keyboard or similar input device, however it should be understood that input device 140 can be any input/output (I/O) device, user interface device, control device, input unit, or the like.

The user-manipulable element is typically described as a knob throughout this disclosure, however it should be understood that any suitable user-manipulable element can be used, such as a button, scroll wheel, trackball, joystick, slider, or the like, as would be understood by one of ordinary skill in the art. A "knob," as described herein, can be interchangeably referred to as a "dial" or "crown."

Input device 140 is typically described as a keyboard throughout this disclosure, however it should be understand that any suitable input device that can include a user-manipulable object, as described herein, can be used including, but not limited to, a computer mouse, a remote control device, a wearable device (e.g., smart watch, wristband, glasses), a smart phone, or the like.

The host computing device is typically described as a desktop or laptop computing device. However, it should be understood that the host computing device can be any suitable computing device further including a tablet computer, a smart phone, a virtual or augmented reality interface (e.g., having 2D or 3D displays), a holographic interface, or the like. One of ordinary skill in the art would understand the many variations, modifications, and alternative embodiments thereof.

Figure 2:
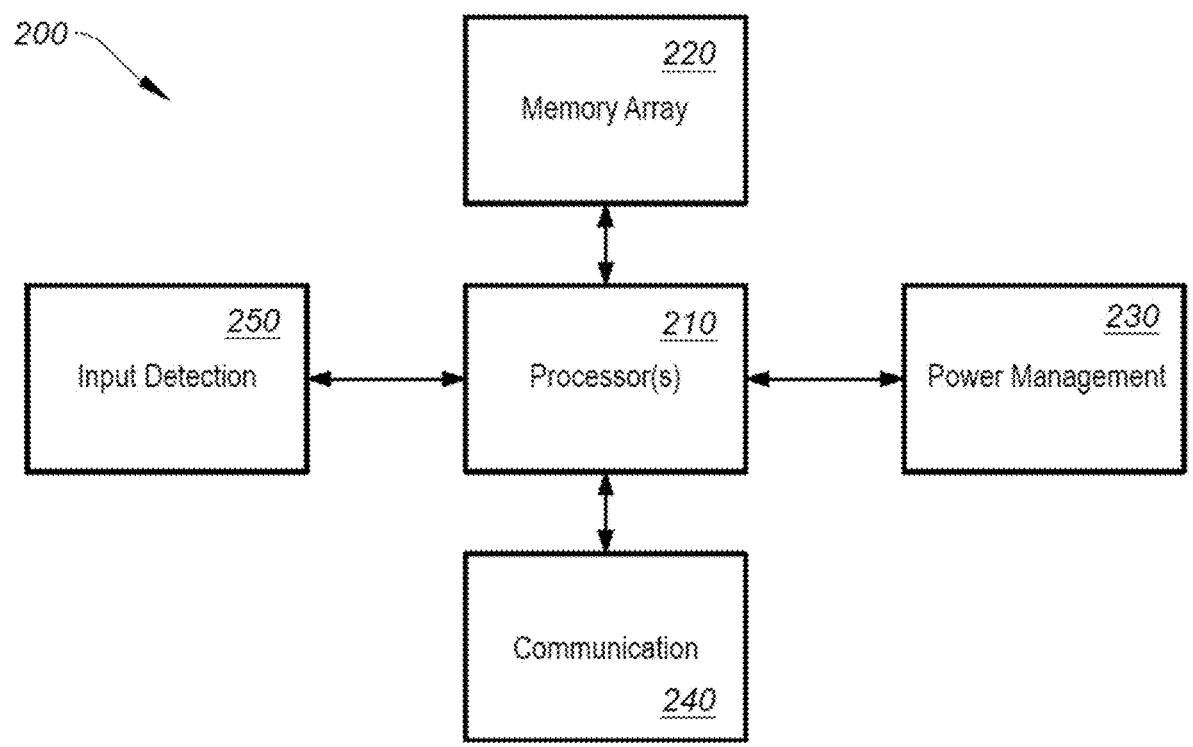
FIG. 2 shows a system for operating an input device, according to certain embodiments.

FIG. 2 shows a system for operating an input device 140, according to certain embodiments. System 200 includes processor(s) 210, memory array 220, power management system 230, communication system 240, and input detection 250. Each of the system blocks 220-250 can be in electrical communication with the processor(s) 210 (e.g., via a bus system). System 200 may further include additional systems that are not shown or discussed to prevent obfuscation of the novel features described herein. System blocks 220-250 may be implemented as separate modules, or alternatively, more than one system block may be implemented in a single module. In the context described herein, input device 140 can be a keyboard with knob 150, as described above with respect to FIG. 1.

In certain embodiments, processor(s) 210 comprises one or more microprocessors (μCs) and can be configured to control the operation of system 200. Alternatively, processor(s) 210 may include one or more microcontrollers (MCUs), digital signal processors (DSPs), or the like, with supporting hardware and/or firmware (e.g., memory, programmable I/Os, etc.), as would be appreciated by one of ordinary skill in the art. Processor(s) 210 can control some or all aspects of operation of input device 140 (e.g., system block 220-250). Alternatively or additionally, some of system blocks 220-250 may include an additional dedicated processor, which may work in conjunction with processor 210. One of ordinary skill in the art would understand the many variations, modifications, and alternative embodiments thereof.

Memory array 220 may be configured to store information pertaining to one or more operational configurations of input device 140. As further discussed below, one or more operational configurations of input device 140 may include setting performance characteristics of knob 150, including but not limited to, a rotation resistance of the knob, a rotational input resolution of the knob (e.g., rotation sensitivity), setting a ratchet or non-ratchet mode of operation to the knob based on the properties of the editable parameter, a function of a depressible knob, a sensitivity of one or more touch sensors on knob 150, functions associated with multiple detected touches on knob 150 (by the touch sensors), their corresponding locations, and the like, as further discussed below.

Memory array 220 can further include stored input values associated with corresponding keys of keyboard 150, as would be understood by one of ordinary skill in the art. Additionally, memory array 220 can store one or more software programs to be executed by processors (e.g., in processor(s) 210). It should be understood that "software" can refer to sequences of instructions that, when executed by processing unit(s) (e.g., processors, processing devices, etc.), cause system 200 to perform certain operations of software programs. The instructions can be stored as firmware residing in read only memory (ROM) and/or applications stored in media storage that can be read into memory for processing by processing devices. Software can be implemented as a single program or a collection of separate programs and can be stored in non-volatile storage and copied in whole or in-part to volatile working memory during program execution.

Power management system 230 can be configured to manage power distribution, recharging, power efficiency, and the like, for input device 140. In some embodiments, power management system 230 can include a battery (not shown), a USB based recharging system for the battery (not shown), and power management devices (e.g., low-dropout voltage regulators—not shown). In certain embodiments, the functions provided by power management system 230 may be incorporated into processor(s) 210. The power source can be a replaceable battery, a rechargeable energy storage device (e.g., super capacitor, Lithium Polymer Battery, NiMH, NiCd), or a corded power supply. The recharging system can be an additional cable (specific for the recharging purpose) or it can use a USB connection to recharge the battery.

Communications system 240 can be configured to provide wireless communication with computer 110, or other devices and/or peripherals, according to certain embodiments. Communications system 240 can be configured to provide radio frequency (RF), Bluetooth®, infra-red (IR), ZigBee®, or other suitable communication technology to communicate with other computing devices and/or peripheral devices. System 200 may optionally comprise a hard-wired connection to computer 110. For example, keyboard 140 can be configured to receive a Universal Serial Bus (USB) cable to enable bi-directional electronic communication with computer 110 or other external devices. Some embodiments may utilize different types of cables or connection protocol standards to establish hardwired communication with other entities.

Input detection 250 can control the detection of a user-interaction with input elements on input device 140. For instance, input module 250 can detect user inputs on knob 150, key presses on the various keys of input device 140 (e.g., QWERTY keys, function keys, number pad keys, etc.), or other suitable input elements or device such as a media control button, voice-over-internet-protocol (VoIP) button, touch sensors (e.g., touch pads) and the like. In some embodiments, input detection 250 can work in conjunction with memory array 220 to detect inputs on input device 150 and associate various functions with each input element (e.g., knob 150).

Although certain necessary systems may not expressly discussed, they should be considered as part of system 200, as would be understood by one of ordinary skill in the art. For example, system 200 may include a bus system to transfer power and/or data to and from the different systems therein.

It should be appreciated that system 200 is illustrative and that variations and modifications are possible. System 200 can have other capabilities not specifically described herein. Further, while system 200 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained.

Embodiments of the present invention can be realized in a variety of apparatuses including electronic devices implemented using any combination of circuitry and software. Furthermore, aspects and/or portions of system 200 may be combined with or operated by other sub-systems as required by design. For example, input detection 250 and/or memory 220 may operate within processor(s) 210 instead of functioning as a separate entity. In addition, the inventive concepts described herein can also be applied to a mouse, keypad, or other similar input device. For instance, aspects of system 200 can be applied to a computer mouse, including knob 150. Further, system 200 can be applied to any of the input devices described in the embodiments herein, whether explicitly, referentially, or tacitly described (e.g., would have been known to be applicable to a particular input device by one of ordinary skill in the art). The foregoing embodiments are not intended to be limiting and those of ordinary skill in the art with the benefit of this disclosure would appreciate the myriad applications and possibilities.

Figure 3:
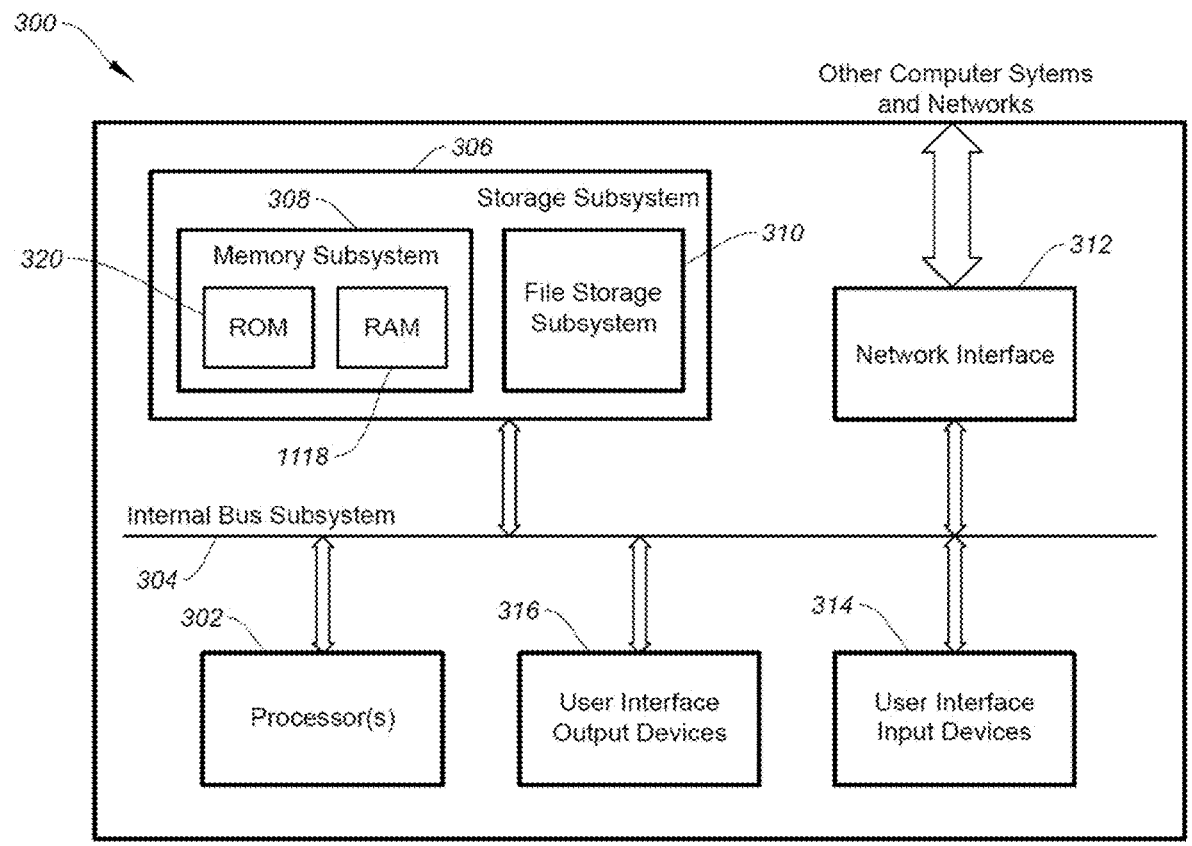
FIG. 3 shows a system for operating a host computing device, according to certain embodiments.

FIG. 3 shows a system 300 for operating a host computing device (e.g., host computing device 110), according to certain embodiments. System 300 can be used to implement any of the host computing devices discussed herein with respect to FIGS. 1 and 4-13 and the myriad embodiments defined herein or within the purview of this disclosure but not necessarily explicitly described. System 300 can include one or more processors 302 that can communicate with a number of peripheral devices (e.g., input devices) via a bus subsystem 304. These peripheral devices can include storage subsystem 306 (comprising memory subsystem 308 and file storage subsystem 310), user interface input devices 314, user interface output devices 316, and network interface subsystem 312. User input devices 314 can be any of the input device types described herein (e.g., keyboard, computer mouse, remote control, etc.). User output devices 316 can be a display of any type, including computer monitors, displays on handheld devices (e.g., smart phones, gaming systems), or the like, as would be understood by one of ordinary skill in the art. Alternatively or additionally, a display may include virtual reality (VR) displays, augmented reality displays, holographic displays, and the like, as would be understood by one of ordinary skill in the art.

In some examples, internal bus subsystem 304 can provide a mechanism for letting the various components and subsystems of computer system 300 communicate with each other as intended. Although internal bus subsystem 304 is shown schematically as a single bus, alternative embodiments of the bus subsystem can utilize multiple buses. Additionally, network interface subsystem 312 can serve as an interface for communicating data between computer system 300 and other computer systems or networks. Embodiments of network interface subsystem 312 can include wired interfaces (e.g., Ethernet, CAN, RS232, RS485, etc.) or wireless interfaces (e.g., Bluetooth®, BLE, ZigBee®, Z-Wire®, Wi-Fi, cellular protocols, etc.).

In some cases, user interface input devices 314 can include a keyboard (keyboard 140), a presenter, a pointing device (e.g., mouse, trackball, touchpad, etc.), a touch-screen incorporated into a display, audio input devices (e.g., voice recognition systems, microphones, etc.), Human Machine Interfaces (HMI) and other types of input devices.

In general, use of the term "input device" is intended to include all possible types of devices and mechanisms for inputting information into computer system 300. Additionally, user interface output devices 316 can include a display subsystem, a printer, or non-visual displays such as audio output devices, etc. The display subsystem can be any known type of display device. In general, use of the term "output device" is intended to include all possible types of devices and mechanisms for outputting information from computer system 300.

Storage subsystem 306 can include memory subsystem 308 and file storage subsystem 310. Subsystems 308 and 310 represent non-transitory computer-readable storage media that can store program code and/or data that provide the functionality of embodiments of the present disclosure. In some embodiments, memory subsystem 308 can include a number of memories including main random access memory (RAM) 318 for storage of instructions and data during program execution and read-only memory (ROM) 320 in which fixed instructions may be stored. File storage subsystem 310 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 300 is illustrative and not intended to limit embodiments of the present disclosure. Many other configurations having more or fewer components than system 300 are possible. The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard or non-standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C# or C++, or any scripting language, such as Perl, Python or TCL, as well as combinations thereof. The server(s) may also include database servers, including without limitation those commercially available from Oracle®, Microsoft®, Sybase® and IBM®.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. F or example, customized hardware might also be used and/or particular elements might be implemented in hardware, software (including portable software, such as applets) or both. Further, connections to other computing devices such as network input/output devices may be employed.

Aspects of the Use and Configuration of the User-Manipulable Element

Figure 4:
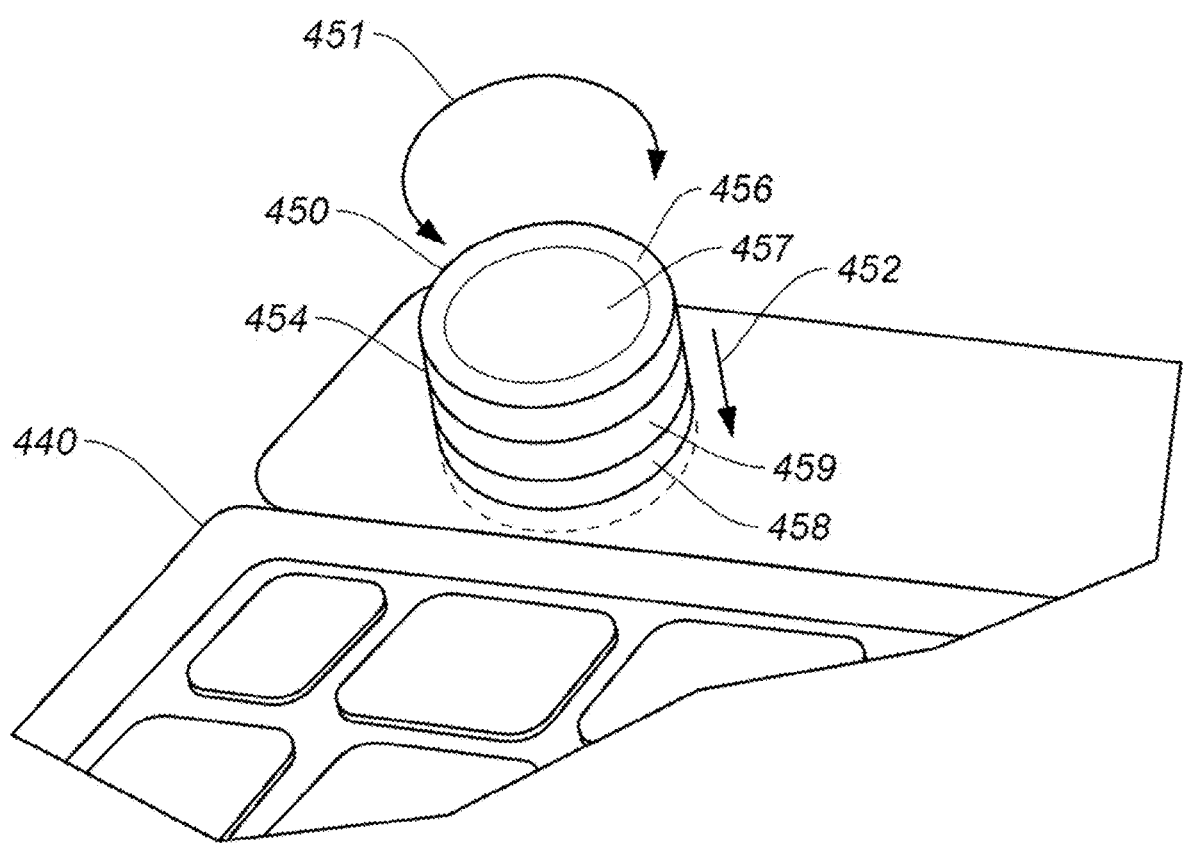
FIG. 4 shows a user-manipulable element, according to certain embodiments.

FIG. 4 shows a user-manipulable element 450, according to certain embodiments. User-manipulable element ("knob") 450 can be disposed on any suitable input device (e.g., keyboard 440) and may include top surface 456 and side surface 458. Top surface 456 may include touch sensor(s) 457 and side surface 458 may include touch sensor(s) 459. Knob 450 can be rotated along path 451 and, in some cases, can be depressible along path 452 to register a "button click" as would be understood by one of ordinary skill in the art.

Knob 450 can include various performance characteristics that can be set or controlled locally (e.g., by processor 210), remotely (e.g., via control signal generated by processor(s) 302), or a combination thereof. Some performance characteristics can include a rotation resistance (of knob 450, a rotational input resolution of knob 450 (e.g., rotation sensitivity), a depressible knob function, setting a ratchet or non-ratchet mode of operation (e.g., via a magnetic clutch and ratchet system disposed in knob 450—as described below in conjunction with FIGS. 5-7) to knob 450 based on properties of an editable parameter (e.g., associated with a selectable control element on a host computing device— further discussed below). In certain embodiments, touch sensors 457, 459 can detect a single touch or simultaneous touches. One performance characteristic of touch sensors can include a touch sensitivity (e.g., resolution). In some cases, one or more touch sensors on knob 450 (e.g., sensor 454, 457) can operate as a touch pad, allowing a user to, e.g., move a cursor on a display. In further embodiments, knob 450 can be a standalone unit. For instance, knob 450 may not be associated with another input device (e.g., keyboard, computer mouse, etc.) and may operate independently (e.g., controlled by system 200).

In certain embodiments, touch sensors 454 and 457 may have similar functions, different functions, or complimentary functions. One example of a complimentary function is that top touch sensor 457 can be used for course adjustments (e.g., large scale zoom) while side touch sensor 454 may control fine adjustments (e.g., small scale zoom). In some cases, top touch sensor 457 can be used to enter a value (see, e.g., FIG. 12A), or open a menu (e.g., pressing sensor 457 opens a visual UI menu allowing a user to switch between functions by rotating knob 450 or selecting with a computer mouse-controlled cursor).

In some cases, a user may want to have a quick-access method of getting back to a global setting, such as a non-context sensitive setting for knob 450. For example, if a user is in a photo editing application and has a specific tool selected, turning knob 450 may change aspects of the selected tool. If the user wants to change a different parameter all together (e.g., volume), pressing down knob 450 (depressing along path 452) and rotating while knob 450 is depressed may be configured to perform an alternative function (e.g., switching to desktop, scroll up/down, volume control, etc.). One of ordinary skill in the art would understand the many variations, modifications, and alternative embodiments thereof.

Rotational resistance can range from no rotational resistance (e.g., no added resistance) to a high resistance to prevent a user from rotating knob 450. For example, if a value (e.g., brightness) can be adjusted to a setting that can range from 0 to 100, knob 450 can be configured to provide a relatively high rotational resistance at each limit. For instance, a rotational resistance may be low (i.e., a user can easily rotate knob 450) from 1-99, and rotational resistance may be high (i.e., a user cannot rotate knob 450 any further) at 0 and 100. In some embodiments, the rotational resistance may follow a particular torque profile such that the rotational resistance is lowest at 50 and increases linearly or non-linearly as the minimum and maximum limits are approached. Any suitable force profile can be applied, as would be understood by one of ordinary skill in the art. Rotational resistance can be referred to as a torque friction, rotational friction, a torque profile (e.g., rotational resistance over a range), or the like.

Ratchet and non-ratchet mode may be set based on any suitable criteria. For example, ratchet mode may better apply to applications that have a finite number of settings, such as a selection of a number of available paint brushes in Photoshop®, a number of font sizes that are available, or the like. A non-ratcheted mode may be well suited for more analog settings that have a continuous or high number of settings, such as a selection of a color from a band of hundreds, thousands, or millions of available colors, a scroll bar (e.g., to scroll through a 100+ page document), a volume, or the like.

Aspects of a Magnetic Ratchet Assembly

Figure 5:
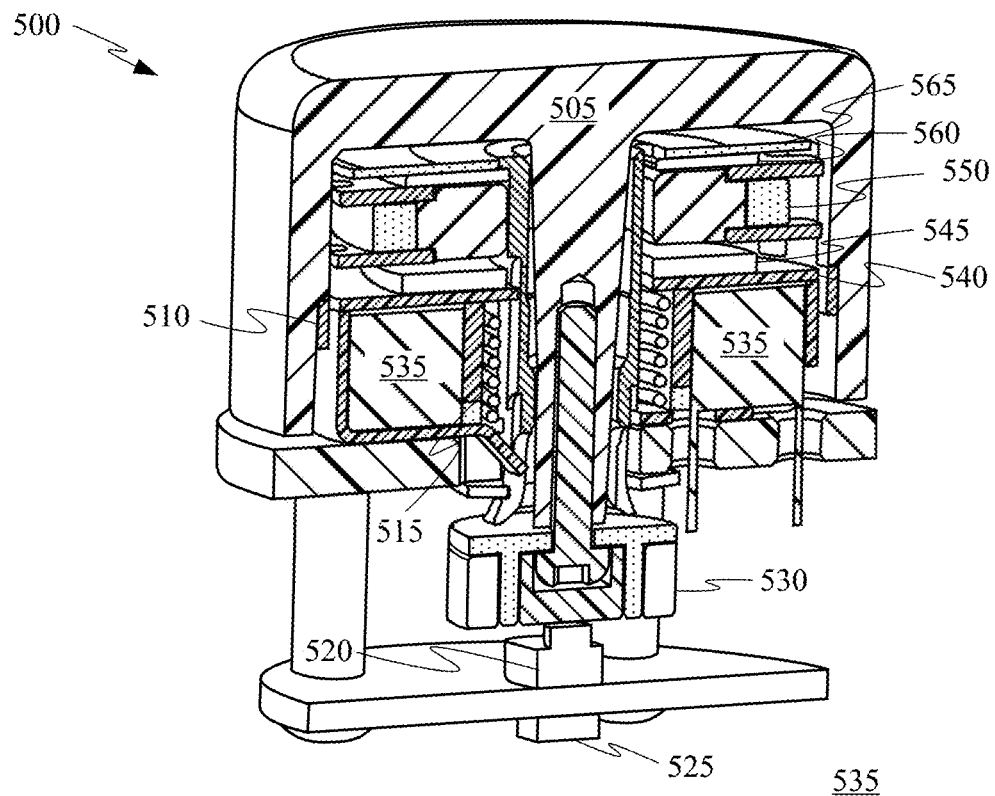
FIG. 5 shows a cutaway view of a user-manipulable element, according to certain embodiments.

FIG. 5 shows a cutaway view of a user-manipulable device ("knob") 500 with a magnetic ratchet system disposed therein, according to certain embodiments. A ratchet system can be used to implement a ratcheting effect on knob 500 when activated. When deactivated, knob 500 may rotate freely with no ratcheting effect. In some embodiments, aspects of the ratcheting including the magnitude of each ratchet (e.g., how much travel between each ratchet "click") and a resistance of the ratchet (e.g., how much force is required to rotate knob 500 in ratchet mode) can be controlled by, for example, processor 210, processor 302, or a combination thereof, as further discussed below. In one example, knob 500 may be configured for a ratcheting mode of operation when a finite or limited number of quantized selections are available and/or low resolution is required. For instance, a font size or font type for alphanumeric text on a GUI may be appropriate. In that case, some users may find that it is intuitive to associate ratcheting or "clicking" with each selection. In another example, knob 500 may be configured for a non-ratcheting mode of operation when a large number of choices are available, high resolution is required, or a continuous gradient or scale of values can be selected. A ratcheting mode, even with high resolution (e.g., small "clicks") would necessarily skip certain values in a continuous spectrum of choices. A non-ratcheting mode can allow a user to select any value with high precision, which may be desirable in certain situations (e.g., selecting a color for a 3D model in a continuous spectrum of available colors). One of ordinary skill in the art would understand the many variations, modifications, and alternative embodiments thereof.

Figure 6:
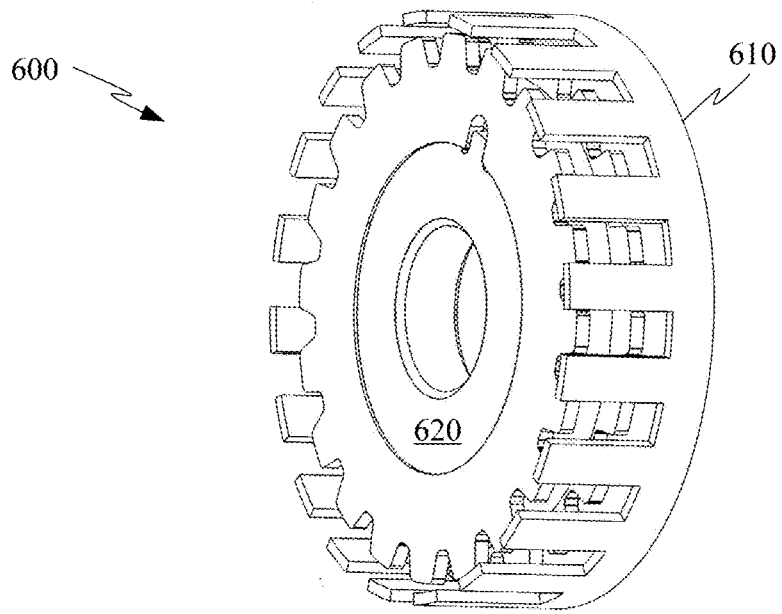
FIG. 6 shows a magnetic ratchet for a user-manipulable element, according to certain embodiments.
Figure 7:
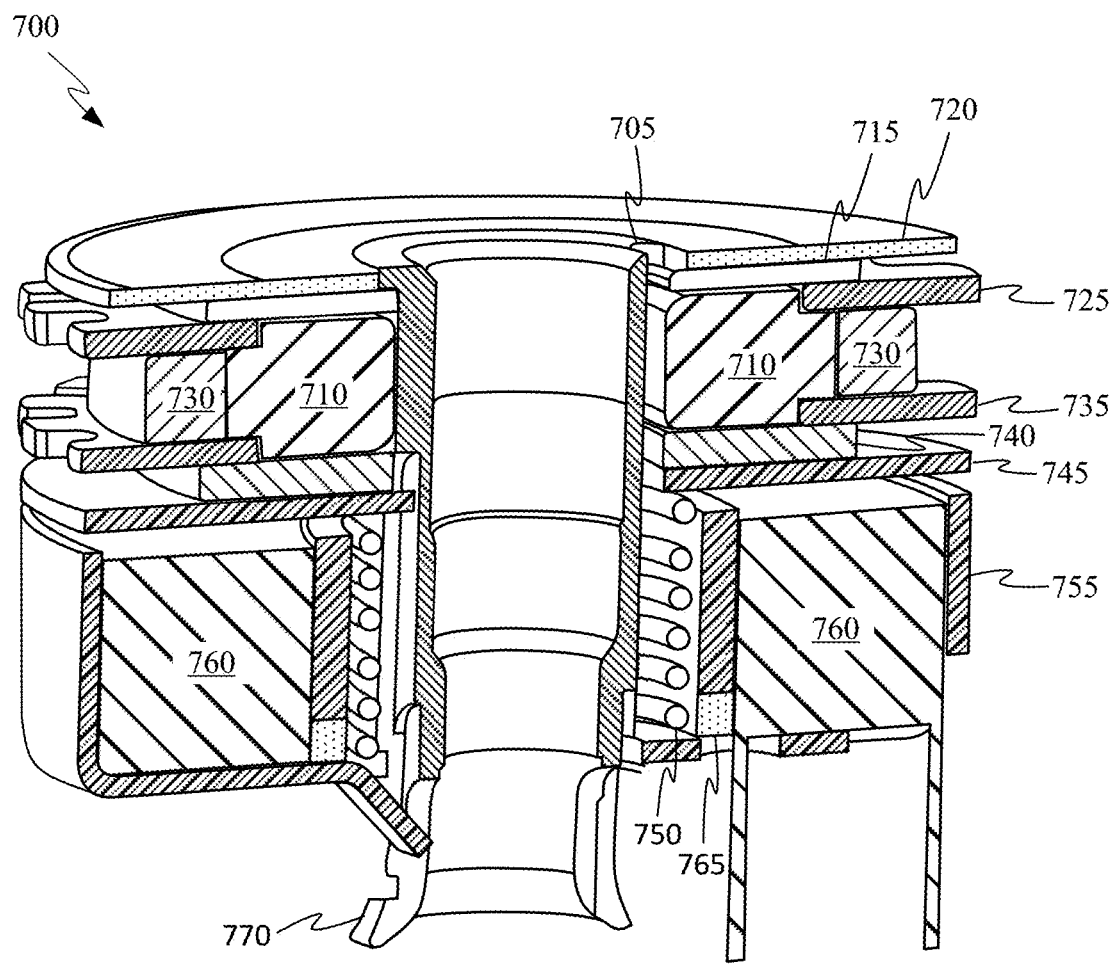
FIG. 7 shows a bi-stable clutch mechanism for an input device, according to certain embodiments.

In certain embodiments, a ratcheting effect is implemented via knob 500, as shown and described with respect to FIGS. 5-7. In some embodiments, a knob with an embedded magnetic ratcheting system may include a magnetic ratchet, a clutch mechanism including a fixed disc and a mobile friction disc, a bi-stable electromagnetic clutch actuator, a magnetic angular sensor, a switch actuated by axial displacement of the knob, and a proximity detector electrode on the shaft end. Referring to FIG. 5, knob 500 includes knob portion 505, ring-shaped knob ratchet armature 510, switch 520, angular sensor 525, angular sensor magnet 530, bi-stable electromagnetic clutch actuator 535, clutch control mobile armature 540, non-magnetic clutch disc 545, switchable magnetic wheel 550, ratchet assembly 555, fixed friction disc 560, and printed circuit board (PCB) with electrode proximity detection 565.

FIG. 6 shows magnetic ratchet 600 for a user-manipulable device, according to certain embodiments. In some embodiments, magnetic ratchet 600 can include two similar armatures with teethed wheels and permanent ring magnet assembled on a magnetically neutral rim. In some embodiments, the magnetically neutral rim can be formed from plastic. The permanent ring magnet can be a rare-earth metal magnet such as a neodymium magnet. Improved torque efficiency can be obtained with two air gaps contributing to a reluctance variation. Furthermore, potential magnetic saturation effects can be reduced due to the magnetic field emitted by the permanent ring magnet being distributed across the many interfaces between the teethed wheels and a ring-shaped knob armature 610. Magnetic ratchet 600 is shown with ring-shaped knob armature 610, and armature magnet assembly 620. Magnetic ratchet 600 can be free to rotate or locked in place depending on an operational state of the user-manipulable device.

FIG. 7 shows a bi-stable clutch mechanism 700 for an electronic input device (e.g., knob 450), according to certain embodiments. The bi-stable clutch mechanism can be realized by utilizing an electromagnet and a nearly constant force helical spring 750. In some implementations, the spring force can contribute to brake the teethed armatures 725 and 735 to achieve the ratcheting effect by pushing non-magnetic clutch disc 740 against a surface of teethed armature 735. When the ratchet is off, the magnetic field generated by ring magnet 765 may attract clutch control armature 745 with a force greater than the spring force, causing the magnetic circuit to remain closed and allowing the ratchet assembly to turn freely. In some embodiments, non-magnetic clutch disc 740 can be placed between the ratchet assembly (teethed armatures) and the clutch control armature to separate the two magnetic circuits. In some cases, the non-magnetic clutch disc can also be used to adapt the gap of the control system because the other parts stacked on the shaft may not be able to be controlled with tight tolerances. The clutch position can be controlled by means of a coil. To switch off the ratchet effect, a current can be fed into the coil in a first direction to produce a pulling force on the clutch control armature (e.g., moving clutch disc), which can be higher than the spring force. To turn the ratchet effect back on, a current can be fed into the coil in a second direction, opposite the first direction. Referring to FIG. 7, bi-stable clutch mechanism 700 can include a passage for an electrode wire 705, a plastic ratchet bearing 710, a clutch fixed magnetic disk 715 (e.g., crimped on the shaft), a PCB with electrode 720, teeth armature 725, ratchet ring magnet 730, teeth armature 735, non-magnetic clutch disc 740, clutch control armature 745, spring 750, coil bell armature 755, coil 760, ring magnet 765 and shaft 770. The operation of which would be understood by one of ordinary skill in the art with the benefit of this disclosure.

Although many of the embodiments described herein use an electro-magnetic actuator to implement the ratchet/non-ratchet functions, it should be understood that other implementations may use different mechanisms to provide a controllable ratchet function. For instance, some embodiments may employ mechanical/friction ratchet mechanisms that can be actuated by a direct current (DC) motor (e.g., see Appendices). One of ordinary skill in the art with the benefit of this disclosure would understand the many variations, modifications, and alternative embodiments thereof.

At a high level of abstraction, software operating on a host computing device (e.g., executed by processor 302) typically manages mapping functions (e.g., mapping editable parameters associated with selectable control element with user-manipulable element (e.g., knob 450) on an input device, as further discussed below) and interfacing between computer software running on the host computing device (e.g., Photoshop®) and the connected input device (e.g., knob 450). Alternatively or additionally, some management may be performed, in part, by aspects (e.g., processor 210) of the corresponding input device. From a user perspective, the user-manipulable element may be associated with the graphical element closest to a cursor on a display. For example, as a user moves a cursor toward a first graphical element (e.g., selectable control element), knob 450 can be dynamically programmed to control an editable parameter (e.g., font type) associated with that graphical element. Similarly, as the user moves the cursor towards a second selectable control element, knob 450 may be automatically and dynamically programmed to control an editable parameter (e.g., volume) associated with the second selectable control element. Alternatively or additionally, associating the user-manipulable object with the editable parameter of a selectable control element can be based on other criteria other than a location of a cursor. For example, a selectable control element may be selected to be associated with a user-manipulable object based on historical usage. Thus, a "most used" selectable control element may be selected irrespective of the location of the cursor. Other methods of selection are possible, as would be understood by one of ordinary skill in the art. The following embodiments describe just some of the many embodiments that fall within the purview of this disclosure.

Figure 8:
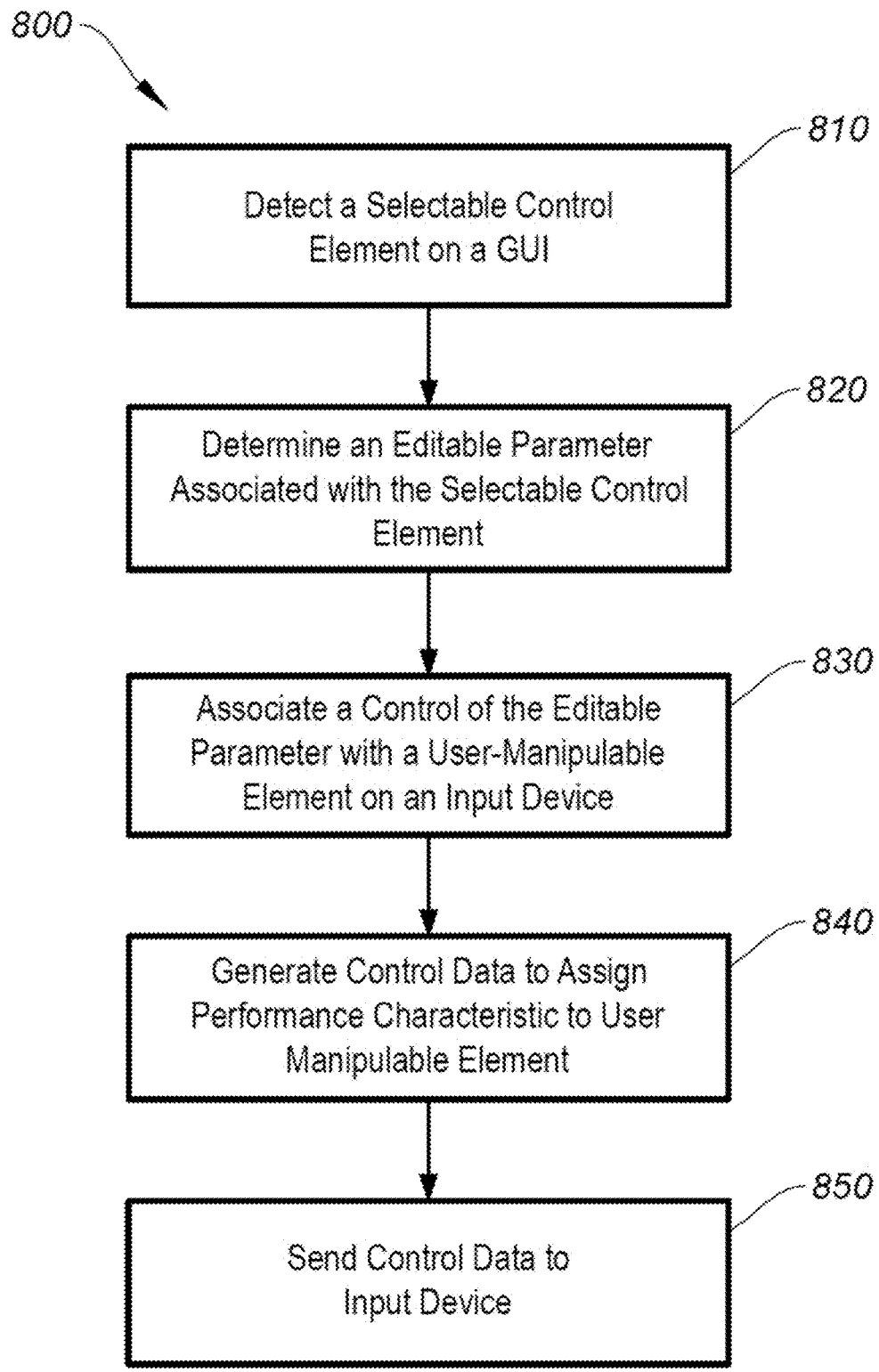
FIG. 8 shows a simplified flow diagram for associating a function with a user-manipulable element on an input device, according to certain embodiments.

FIG. 8 shows a simplified flow diagram 800 for associating a function with a user-manipulable element on an input device, according to certain embodiments. Method 800 can be performed by processing logic that may comprise hardware (circuitry, dedicated logic, etc.), software operating on appropriate hardware (such as a general purpose computing system or a dedicated machine), firmware (embedded software), or any combination thereof. In certain embodiments, method 800 can be performed by processor 302 of system 300, as shown and described above with respect to FIGS. 1 and 3.

At step 810, method 800 can include detecting, by a processor 302 on a host computing device 110, a selectable control element on a graphical user interface (GUI), according to certain embodiments. A GUI can be a graphical window, virtual desktop, applications, or any image on a display (e.g., display 120) that a user can interact with. A selectable control element can include any graphical element that can be controlled by a user. For example, some common selectable control elements can include desktop or window-based selectable icons, scroll bars, task bar elements, tabs, text, media players, media player controls (e.g., volume, pan, bass/treble, media transport controls, etc.), hyperlinks, or the like. One of ordinary skill in the art would understand the many possible types of selectable control elements that could be selectable on a GUI. In some embodiments, some control elements may not be "selectable" such that a user cannot manipulate or interact with the control element. For instance, a web page or PDF document may have a single page with no controllable element (e.g., no scroll bar). In such instances, non-selectable elements, such as alphanumeric text may be detected and used as described herein. In further embodiments, certain control elements may not be "selectable" from a current view and may be nested in various dropdown menus or interfaces. For example, a media player may include different skins (e.g., background images) with a selectable list of skins (i.e., the control element) buried in a nested menu. In such instances, the control element is not immediately selectable in a current view (outside of the corresponding menu bar), but can be detected nonetheless by host computing device 110. In certain embodiments, software configuring knob 450 may access particular software operating on the host computing device to determine what elements are included in a particular window. For instance, presentation software can be accessed to determine what is included in each particular slide (e.g., embedded hyperlinks, spreadsheets, images, etc.), which is readily available and easily accessible as would be understood by one of ordinary skill in the art. Similarly, photo editing software (e.g., Photoshop®) can be accessed to determine what selectable control elements (e.g., icons, menus, etc.) are available. It should be understood that the various methods of identifying elements described with respect to FIG. 8 can be applied to any of the figures, embodiments, systems, or methods, etc., described herein, as would be understood by one of ordinary skill in the art.

At step 820, method 800 can include determining, by processor 302, an editable parameter associated with the selectable control element, according to certain embodiments. An editable parameter can be any adjustable value, setting, mode of operation, or the like, associated with the selectable control element. For example, a selectable control element can be alphanumeric text and the editable parameter can include a font size, font type, font color, text position (e.g., text can be moved on the display in an x and y direction), or the like. In another example, a media player can be the selectable control element and the editable parameter can include a volume, pan, bass/treble settings, media transport controls, and the like. In a further example, a photo may be the selectable control element and the editable parameters can include a zoom (magnification), pan control, brightness, contrast, filter selection, etc. One of ordinary skill in the art would understand the many variations, modifications, and alternative embodiments of possible selectable control elements and editable parameters.

At step 830, method 800 can include associating a control of the editable parameter with user-manipulable element 150 on an input device 140, according to certain embodiments. User-manipulable element 150 can be a knob, button, scroll wheel, trackball, joystick, slider, or the like, as would be understood by one of ordinary skill in the art. One example of associating a control of the editable parameter with user-manipulable element 150 (knob 150) can include associating a font-size selection for alphanumeric text on display 120 with knob 150. More non-limiting examples of are provided in FIGS. 9-13C. The examples provided herein generally describe associating a control of the editable parameter with a single user-manipulable element 150. Some embodiments may associate the editable parameter with multiple user-manipulable elements 150. In some cases, the same editable parameter for a selectable control element can be associated with different user-manipulable elements 150 based on certain contexts. For instance, a volume control on a media player may be associated with knob 150 during typical use, but may opt to associate the volume control with a slider or touch sensor on keyboard 140 when certain applications (e.g., digital audio workstation) are in use to, for example, make knob 150 available for other purposes. Control data and control signal can be used interchangeably throughout this disclosure.

At step 840, method 800 can include generating control data to assign a performance characteristic to user-manipulable element 150 based on properties of the editable parameter. The control data can be in any suitable format that can control aspects (e.g., user-manipulable element 150) of input device 140, as would be understood by one of ordinary skill in the art. A performance characteristic for knob 150 can include a rotation resistance of the knob, a rotational input resolution of the knob (e.g., rotation sensitivity), setting a ratchet or non-ratchet mode of operation for the knob (e.g., via an internal magnetic clutch) based on the properties of the editable parameter, or a depressible feature (e.g., knob 150 can be depressed like a button click). For buttons, touch sensors, sliders, or any other user-manipulable element 150, editable parameters can include button sensitivity, touch sensitivity, haptic feedback intensity, or the like. One of ordinary skill in the art would understand the many variations, modifications, and alternative embodiments thereof. Steps 830 and 840 can be separate steps or can be performed in a single step (e.g., generating control data to both associate an editable parameter with a user-manipulable element and assign a performance characteristic to the user-manipulable element. At step 850, method 800 can include sending, by the host computing device (e.g., processor 302), the control signal to the input device (e.g., processor 210).

It should be appreciated that the specific steps illustrated in FIG. 8 provide a particular method 800 for assigning a function to a user-manipulable element on an input device, according to certain embodiments. Other sequences of steps may also be performed according to alternative embodiments. For example, alternative embodiments may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. For example, method 800 can further include receiving a first input data corresponding to a rotation of the knob, receiving a second input data corresponding to the rotation of the knob, and applying the first input data and second input data to the editable parameter as a single continuous input when the first and second inputs are received within a threshold time. In this example, a user may turn knob 150 by 180 degrees, let go of knob 150, and re-grab knob 150 to turn it for an additional 70 degrees (e.g., if the user cannot sufficiently turn knob 150 in a single turn). To determine whether the user intended the two turns to be separate or treated as a single continuous turn, a threshold time (e.g., less than 1 second) can be tracked between each input. For multiple inputs that occur within the threshold time, the inputs can be treated as a single continuous input. Any suitable threshold time can be used, which may be shorter or longer that the examples provided herein.

In another example, method 800 can further include receiving, by processor 302, input data corresponding to a movement of a cursor on the GUI, where the detecting the selectable control element on the GUI occurs in response to detecting when the cursor is placed over the selectable control element. One of ordinary skill in the art would recognize and appreciate many variations, modifications, and alternatives of method 800.

Figure 9:
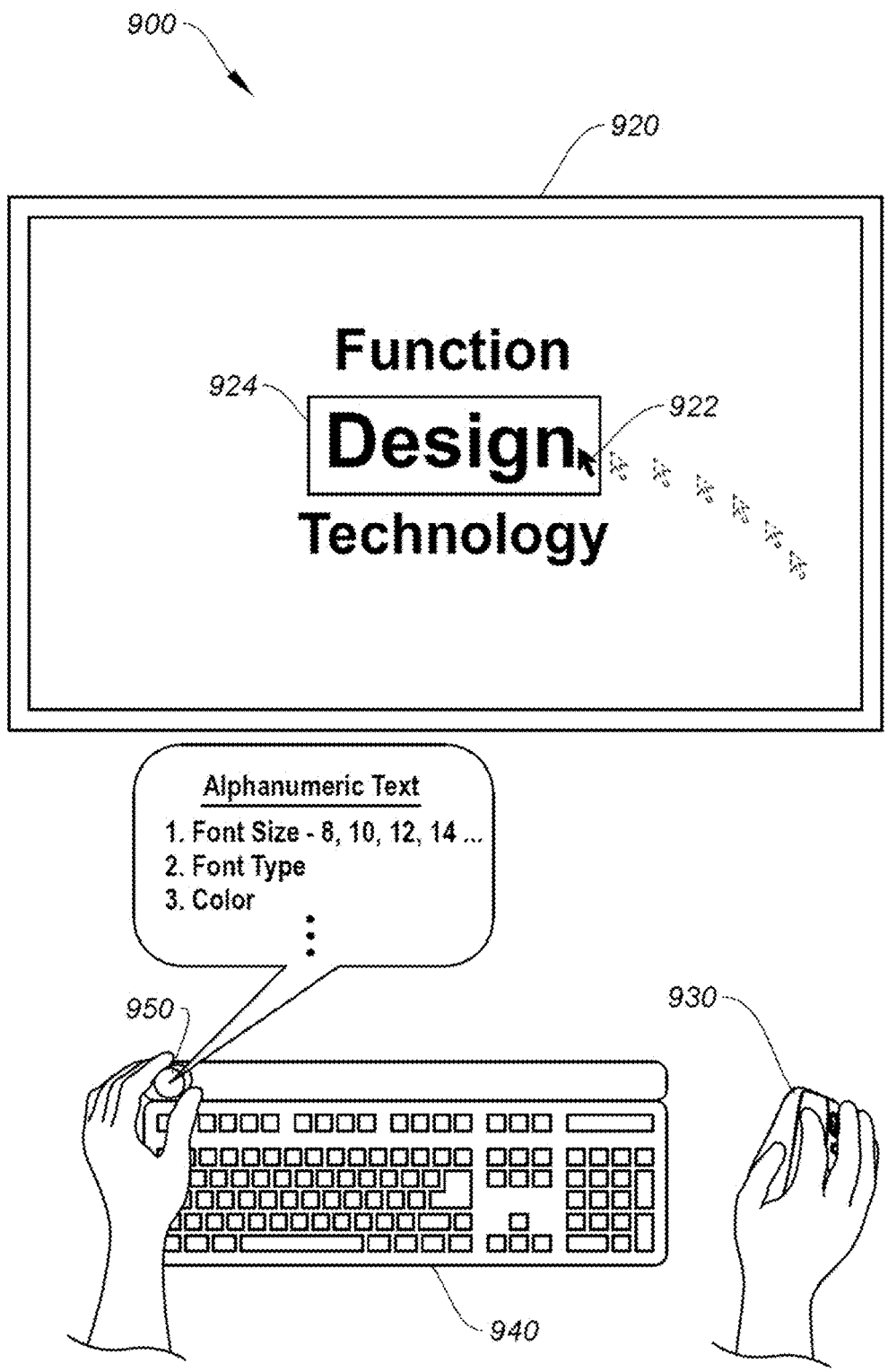
FIG. 9 shows aspects of associating a function with a user-manipulable object, according to certain embodiments.

FIG. 9 shows aspects of a system 900 for associating a function with an input device that corresponds to a selectable control element on a display, according to certain embodiments. More specifically, a user manipulates first input device 930 (e.g., computer mouse, presenter, etc.) to move cursor 922 over selectable control element ("text") 924 on display 920. The host computer (e.g., host computer 110) can then detect control element 924, determine certain editable parameters associated with text 924, associate a control of the editable parameter with a user-manipulable element (e.g., knob 950) on a second input device (e.g., keyboard 940) and generate a control signal to cause the second input device (e.g., processor 210 of keyboard 940) to assign a performance characteristic (e.g., knob rotation) to the user-manipulable element based on properties of the editable parameter. For instance, text 924 can include editable parameters such as font size and font type, which can include a number of discrete values. Thus, processor 302 may determine that a rotation function would be better suited to cycle through available values (e.g., font sizes 8-72) then successive button presses (e.g., depressing knob 950) or successive touch sensor touches (e.g., touch sensor 457) may be. In some embodiments, processor 210 of input device 940 may determine the appropriate user-manipulable element to apply, while host computer 110 merely sends a control signal indicating what editable parameters need to be assigned. In some cases, the assignment can be controlled, in part, by both processors 302 and 210. One of ordinary skill in the art with the benefit of this disclosure would understand the many variations, modifications, and alternative embodiments thereof.

In some embodiments, multiple editable parameters can be associated with a user-manipulable element (e.g., rotation of knob 950) and prioritized in a hierarchical fashion. Referring to FIG. 9, a font size, font type, and font color are associated with alphanumeric text 924 and assigned to knob 950, respectively. In certain aspects, a user can cycle through and switch between each editable parameter. For instance, a detected touch on a touch sensor (e.g., sensor 457) may execute a switch from font size to font type. A subsequently detected touch on the touch sensor may cause a switch from font size to font color, and so on. One of ordinary skill in the art would understand the many variations, modifications, and alternative embodiments thereof.

The example shown in FIG. 9 shows a user manually selecting control element ("text") 924. Alternatively or additionally, system 900 may automatically select a selectable control element without requiring user interaction. Automatic selection can be performed based on any suitable criteria, such as a hierarchy of preferred editable parameters, by machine learning based on previous user selections and interactions, by application-based preset conditions, or the like, and by any combination thereof.

Figure 10:
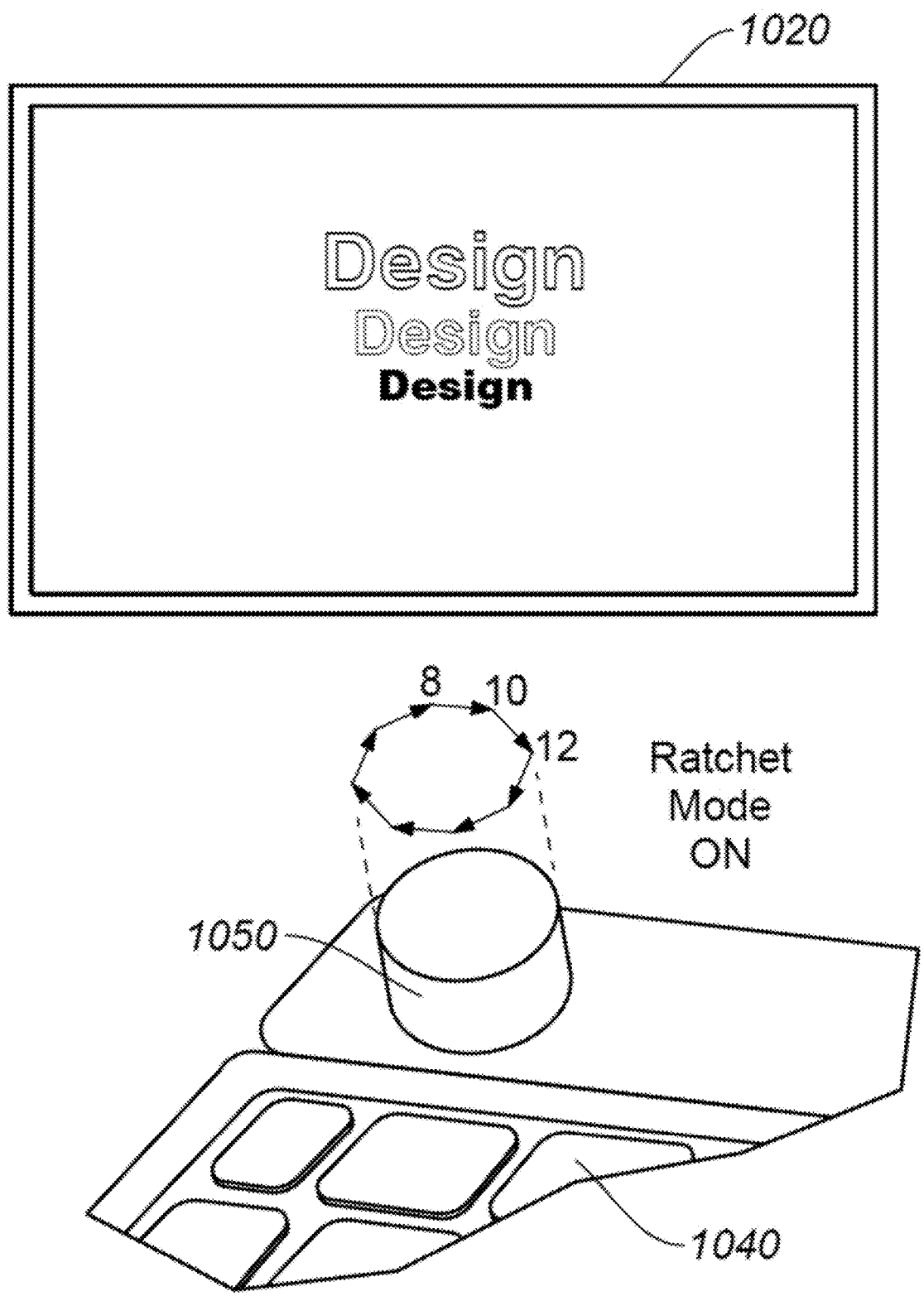
FIG. 10 shows aspects of associating a function with a user-manipulable object on an input device, according to certain embodiments.

FIG. 10 shows aspects of associating a function with a user-manipulable object 150 on an input device 1040, according to certain embodiments, and includes display 1020 (e.g., operated by aspects of system 300), keyboard 1040 (e.g., operated by aspects of system 300), and knob 1050. As described above, a ratchet or non-ratchet mode of operation can selectively be applied to a user-manipulable control based on properties of a corresponding editable parameter. In some cases, it may be advantageous to apply a ratchet mode of operation to knob 1050 when alphanumeric text is detected on display 1020, as a limited number of discrete settings (e.g., font size, font type, number of brushes, number of selectable tabs, etc.) may be more intuitively controlled with discrete positions on knob 1050. Referring to FIG. 10, as knob 1050 is rotated clockwise, larger discrete font sizes (or any suitable editable parameter associated with a detected selectable control element) are applied to the corresponding text (e.g., selectable control element) on display 1020. In alternative embodiments, font size or font type could, for example, be associated with knob 1050 having the ratchet mode turned off such that the rotation of knob 1050 is smooth and changes in the underlying editable parameter can be configured to change between values as knob 1050 is rotated a certain distance (e.g., switch values every 20 degree rotation). In some embodiments, multiple performance characteristics may be associated with a single editable parameter. For instance, knob 1050 may be configured to control a font type as knob 1050 is rotated, a ratchet mode may be applied, and a resistance of rotation may be configured to increase or decrease as the selected values increase or decrease. One of ordinary skill in the art would understand the many variations, modifications, and alternative embodiments thereof.

In some embodiments, the number of ratchet positions in 360 degrees of rotation can be controlled by software operating on host computing device (e.g., via method 800). In some cases, a ratchet torque (e.g., rotational resistance) can be configured to correspond to a number of ratchet positions. For example, a low number of ratchet positions (e.g., line width) may have a higher relative rotational resistance associated with it (e.g., harder for a user to rotate knob 1050), while a high number of ratchet positions (e.g., number of brushes) may have a lower relative rotational resistance associated with it (e.g., easier for a user to rotate knob 1050). Some embodiments can include very high rotational resistance when a minimum or maximum software value is reached to indicate to the user that the corresponding parameter (e.g., volume) cannot be increased or decreased beyond a current value. In some cases, a default value may have a higher rotation resistance than adjacent ratchet settings to indicate a center position, default value, preferred setting, or the like. One of ordinary skill in the art would understand the many variations, modifications, and alternative embodiments thereof.

Figure 11:
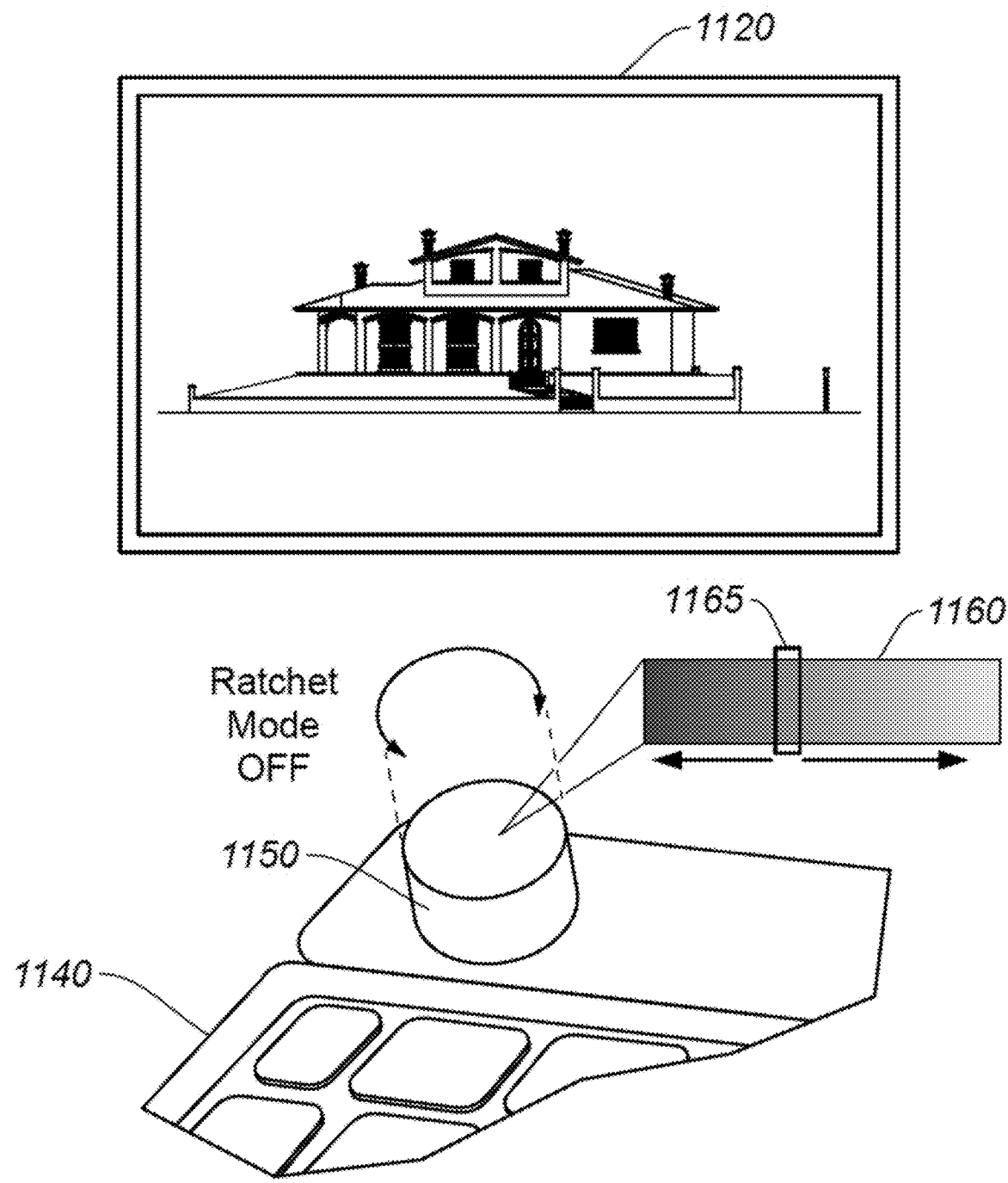
FIG. 11 shows aspects of associating a function with a user-manipulable object on an input device, according to certain embodiments.

FIG. 11 shows aspects of associating a function with a user-manipulable object 1150 on an input device 1140, according to certain embodiments, and includes display 1120 (e.g., operated by aspects of system 300), keyboard 1140 (e.g., operated by aspects of system 300), and knob 1150. As described above, a ratchet or non-ratchet mode of operation can selectively be applied to a user-manipulable control based on properties of a corresponding editable parameter. In some cases, it may be advantageous to apply a non-ratchet mode of operation to knob 1150 when an image is detected on display 1120 and a corresponding editable parameter has a very high number of settings (e.g., continuous, high resolution color gradient). In such cases, it may be more intuitively controlled with a continuous rotation on knob 1150. Referring to the non-limiting example shown in FIG. 10, as knob 1150 is rotated clockwise, value indicator 1165 can increase as it moves to the right on color gradient selection bar 1160. Typically, non-ratchet conditions may be well-suited for editable parameters that have high granularity, sensitive adjustments, or the like. Alternatively, some embodiments may employ a ratchet mode of operation to select colors. One of ordinary skill in the art would understand the many variations, modifications, and alternative embodiments thereof.

In certain embodiments, a non-ratchet mode may be applied to provide a user with an "analog" control over the associated editable parameter. In some cases, the friction torque (e.g., rotational resistance) of knob 1150 can depend on the software parameter type (e.g., editable parameter). For instance, scrolling in a large document may cause knob 1150 to be configured in non-ratchet mode with a low rotational resistance (e.g., for fast scrolling), while a volume control (e.g., selectable control element) may cause knob 1150 to have a high rotational resistance (e.g., to prevent inadvertent large changes in volume). Rotational resistance may be set to a maximum value when a minimum or maximum value for an editable parameter is met (e.g., scroll at top or bottom of document). In some cases, a default value may have a higher rotational resistance than adjacent settings of knob 1150 to give the impression of a single ratchet "dip" at a default position. One of ordinary skill in the art would understand the many variations, modifications, and alternative embodiments thereof.

Figure 12A:
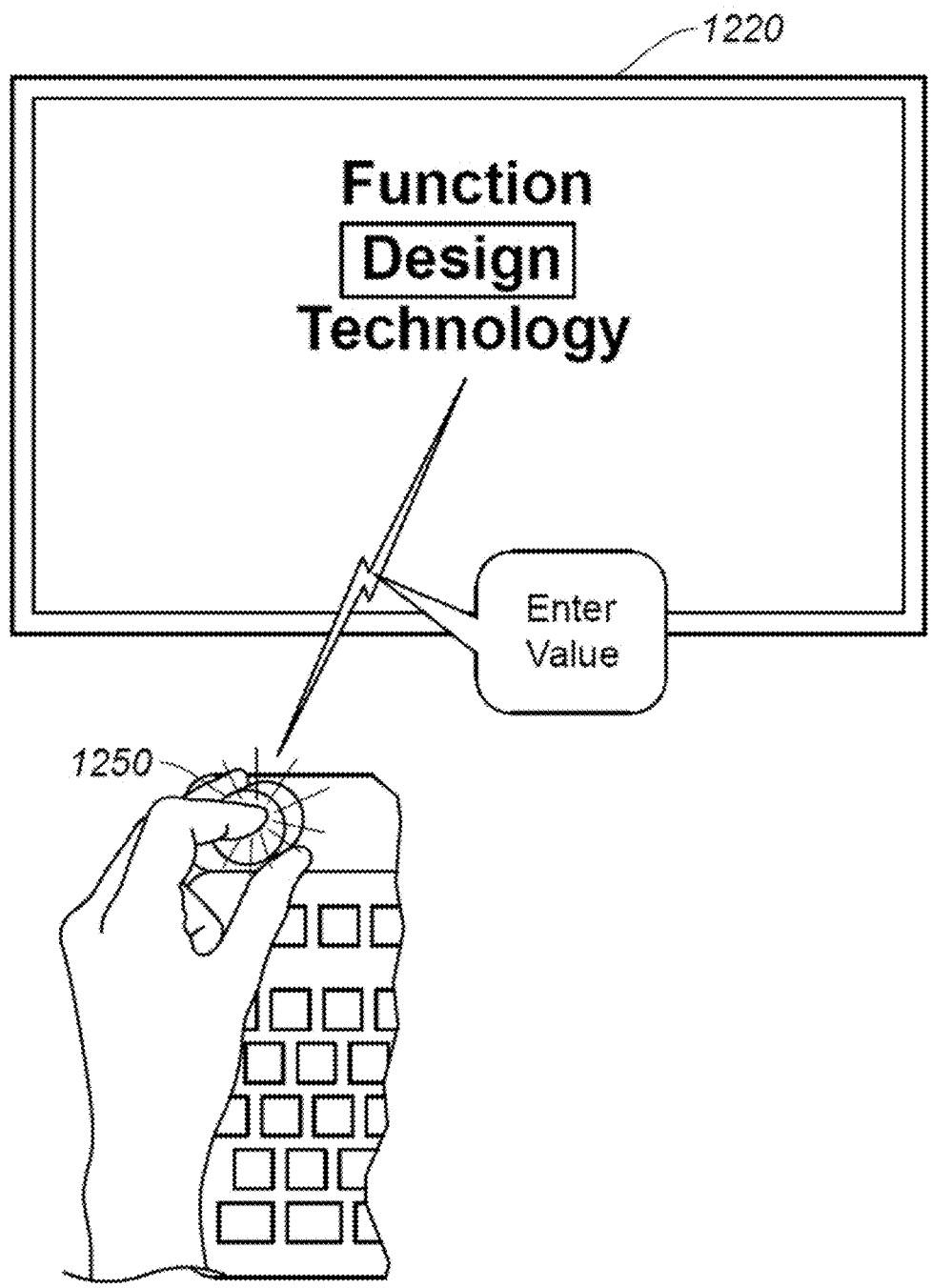
FIG. 12A shows aspects of associating a function with a user-manipulable object on an input device, according to certain embodiments.

FIG. 12A shows aspects of associating a function with a user-manipulable object on an input device, according to certain embodiments. In certain situations, a user may want to cycle through a number of settings and/or values to determine a preferred outcome without necessarily entering the value until they are sure of their selection. In such cases, a touch sensor (e.g., touch sensor 457) disposed on knob 1250 can be configured to enter a currently selected value when touched. Referring to FIG. 12A, the alphanumeric text "design" is selected and the user is manipulating knob 1250 to set a particular value for a corresponding editable parameter (e.g., font size). The user can then tap the touch sensor on knob 1250 to "enter" the value selected, thereby confirming a user intent to apply a specific setting. In some embodiments, processor 210 may receive the touch sensor input signal and relay the signal to the corresponding host computing device (e.g., host computer 110) to apply the setting. Alternatively or additionally, the control signal from the host computer that initially detected the "design" text and determined one or more associated editable parameters may cause the touch sensor of knob 1250 to control the "enter value" function as described above. In some cases, the control signal may provide the editable parameters and the input device (e.g., processor 210) may select and control which user manipulable element is assigned the "enter value" function. One of ordinary skill in the art would understand the many variations, modifications, and alternative embodiments thereof.

Figure 12B:
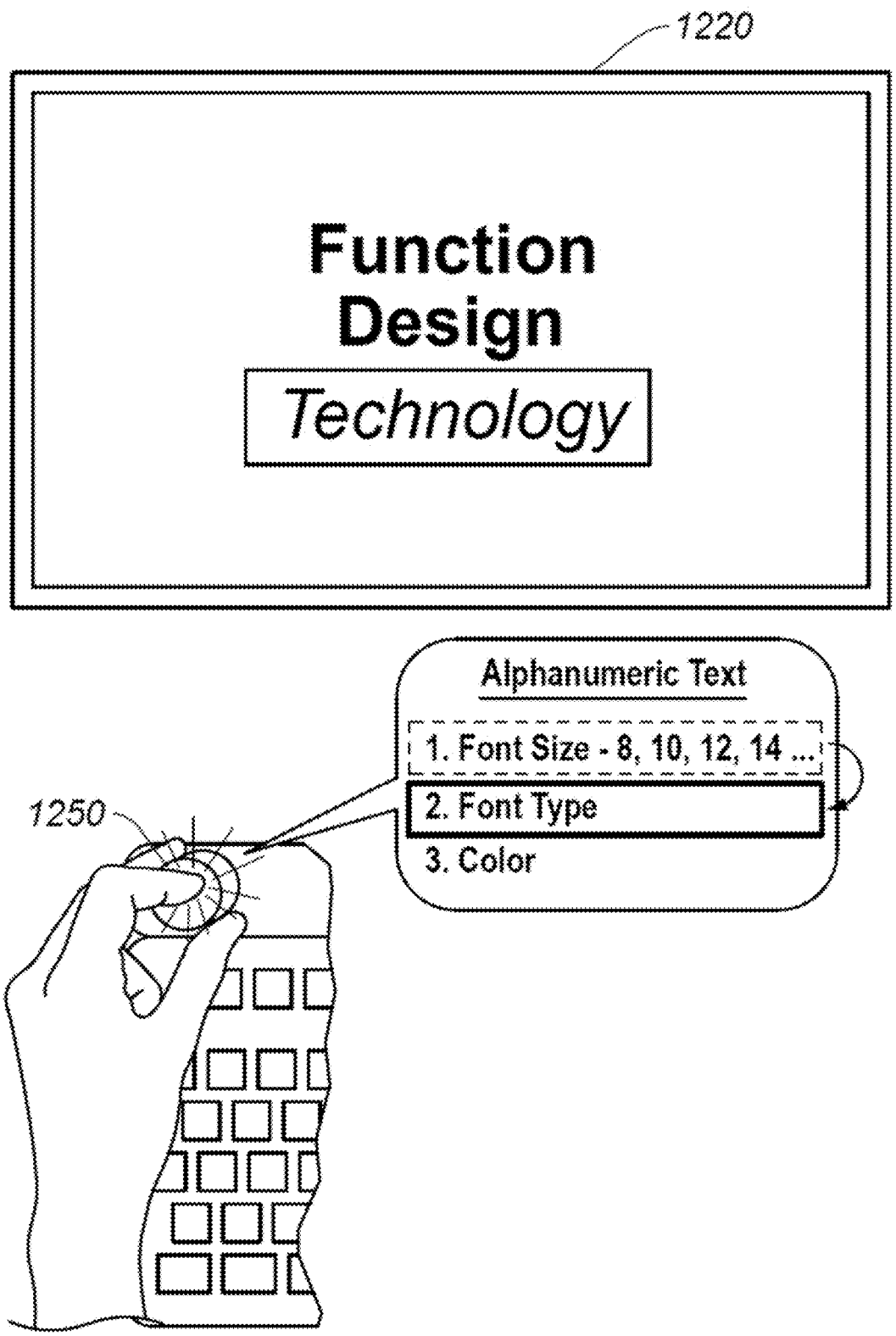
FIG. 12B shows aspects of associating a function with a user-manipulable object on an input device, according to certain embodiments.

FIG. 12B shows aspects of associating a function with a user-manipulable object on an input device, according to certain embodiments. In certain situations, a user may want to switch between editable parameters to achieve a particular setting for the selectable control element. In such cases, a touch sensor (e.g., touch sensor 457) disposed on knob 1250 can be configured to switch between selectable elements associated with a currently selected control element. Referring to FIG. 12B, the alphanumeric text "technology" is selected. In response to the user touching the touch sensor, the selected editable parameter switches from font size to font type, and subsequent rotations of knob 1250 change the font type accordingly. In some embodiments, processor 210 may receive the touch sensor input signal and relay the signal to the corresponding host computing device (e.g., host computer 110) to apply the setting. Alternatively or additionally, the control signal from the host computer that initially detected the "design" text and determined one or more associated editable parameters may cause the touch sensor of knob 1350 to control the "enter value" function as described above. In some cases, the control signal may provide the editable parameters and the input device (e.g., processor 210) may select and control which user manipulable element is assigned the "switch" function. In some embodiments, the switching function (or any function) can be associated with other controls, keys, etc. (e.g., assigned hot keys, function keys, etc., of a corresponding input device).

Some embodiments may associate other functions with the one or more touch sensors on knob 1250. For instance, short presses, long presses, multiple presses, and the like, can be configured to cause different functions to occur. In some cases, a single short press may implement validation (e.g., enter a value of an editable parameter—as described above), a long press may switch the editable parameter of the corresponding selectable control element, and a double tap may change a position in a menu hierarchy (e.g., switching from a first level including fonts, colors, and tools, to a lower level of fonts including font size and font type). One of ordinary skill in the art would understand the many variations, modifications, and alternative embodiments thereof.

Proximity detection can be used with the one or more touch sensors, according to certain embodiments. For instance, power management functions (e.g., operated by power management block 230) may be associated with proximity detection where the supporting electronics for knob 1250 can turn on when a user's hand is determined to be in close proximity, which may be advantageous for power sensitive cordless input devices (e.g., keyboards, computer mice, etc.). One of ordinary skill in the art would understand the many variations, modifications, and alternative embodiments thereof.

Figure 13A:
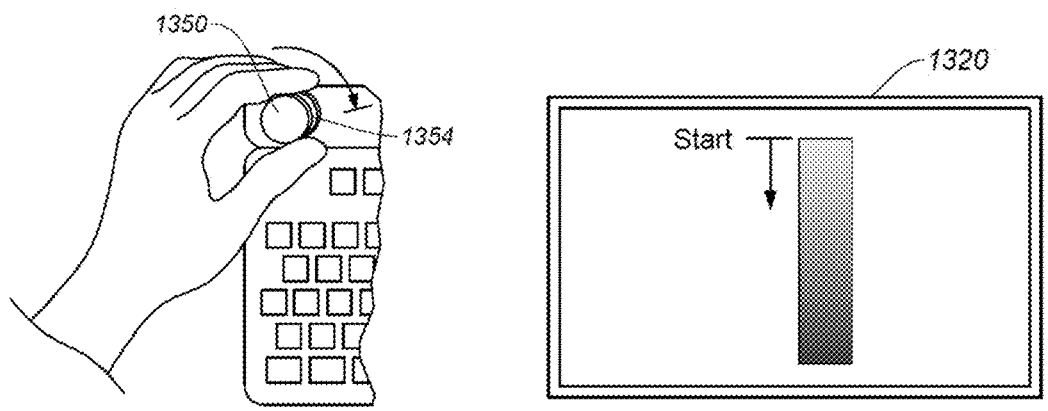
FIGS. 13A-13C show aspects of associating a function with a user-manipulable object on an input device, according to certain embodiments.
Figure 13B:
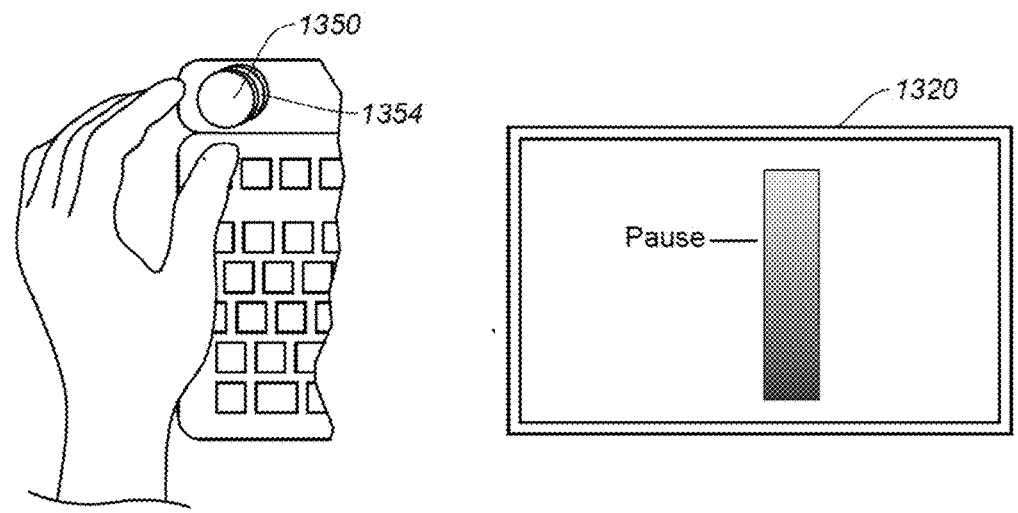
Figure 13C:
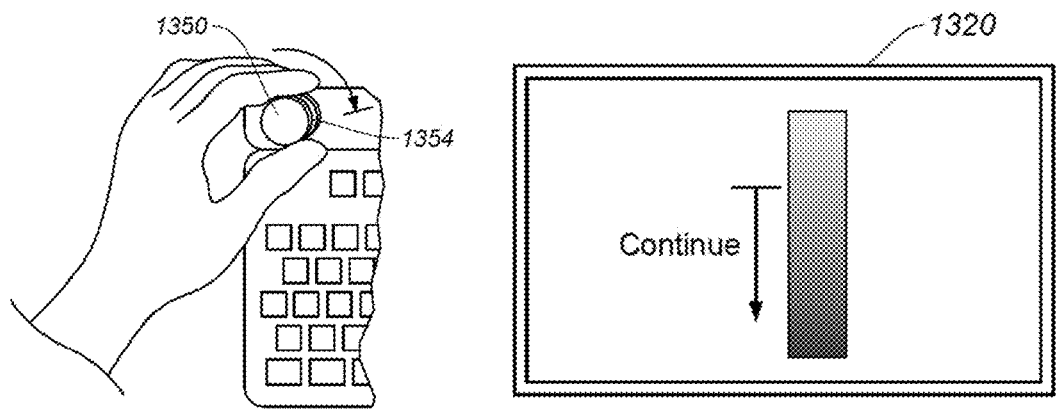

FIGS. 13A-13C show aspects of associating a function with a user-manipulable object, according to certain embodiments. FIGS. 13A-13C include display 1320 with a selected control element (e.g., gray scale gradient bar), a knob 1350 on an input device, and a corresponding touch sensitive region 1354 around a side portion or perimeter of knob 1350. Touch sensitive region 1354 can also extend across a top surface of 1350. In some cases, a user may wish to adjust an editable parameter associated with knob 1350 to a value that they cannot reach with a single rotation. In some configurations, an adjusted value may revert back to a default value when a user let's go of knob 1350 (e.g., touch sensor 1354 may detect that a user is no longer touching knob 1350). This may be the case when entering a value occurs in response to touching a touch sensor, as discussed above with respect to FIG. 12A. With this setting, it can be cumbersome and inefficient is a user has to keep their fingers on a touch sensor while trying to rotate a knob beyond 270 degrees or more, for example. One solution may be to tap touch sensor 1250 half way through the rotation to "save" the setting and then re-grip the knob to continue the rotation.

In certain embodiments, a threshold time can be used to determine when an input is intended to be completed. For instance, in FIG. 13A, the user rotates knob 1350 approximately 100 degrees causing an adjustment of a gray-scale gradient bar on display 1320. In FIG. 13B, the user let's go of knob 1350 and repositions his hand to continue rotating knob 1350, causing adjustment of the gradient bar to pause. In FIG. 13C, the user continues the rotation of knob 1350 for an additional 100 degrees, thereby causing the adjustment of the gradient bar to continue. In some embodiments, if the time between the user letting go of knob 1350 in FIG. 13B and re-gripping knob 1350 in FIG. 13C is less than a threshold time (e.g., 2 seconds), then the adjustments of FIGS. 13A and 13C are treated as a continuous adjustment and the default auto-reset function mentioned above would be avoided. The threshold time can be any suitable value and may be shorter or longer than the examples provided herein. Thus, in certain embodiments, processor 210 can receive a first input data corresponding to a rotation of knob 1350, receive a second subsequent input data corresponding to the rotation of knob 1350, and apply the first input data and second input data to a corresponding editable parameter as a single continuous input when the first and second inputs are received within the threshold time.

In some embodiments, touch sensors 1354 can detect multiple simultaneous touches (e.g., thumb, forefinger, and middle finger detection when adjusting knob 1350), which can be useful for location-dependent touch detection. For instance, some embodiments may increase a sensitivity of the adjustment of an editable parameter when a user grips knob 1350 with three fingers instead of two. In some cases, a memory buffer (e.g., memory array 220 or 308) can be used to store how certain users interact with knob 1350. For instance, a first user may typically use two fingers at diametrically opposed locations on knob 1350 (i.e., user grip profile), while a second user may typically grip knob 1350 with three fingers, or with two fingers at different non-diametrically opposed locations. In such instances (e.g., through machine learning via processor 210 and/or 302), certain editable parameters with particular sensitivities may be assigned to knob 1350 in response to detecting a particular selectable control element when the first user is determined to be interacting with knob 1350 (e.g., based on previous first user interactions), and different editable parameters with different sensitivities may be assigned to knob 1350 in response to detecting the selectable control element when the second user is determined to be interacting with knob 1350 (e.g., based on the grip profile). One of ordinary skill in the art would understand the many variations, modifications, and alternative embodiments thereof.

Description of First Magnetic Ratchet Embodiment

Figure 14A:
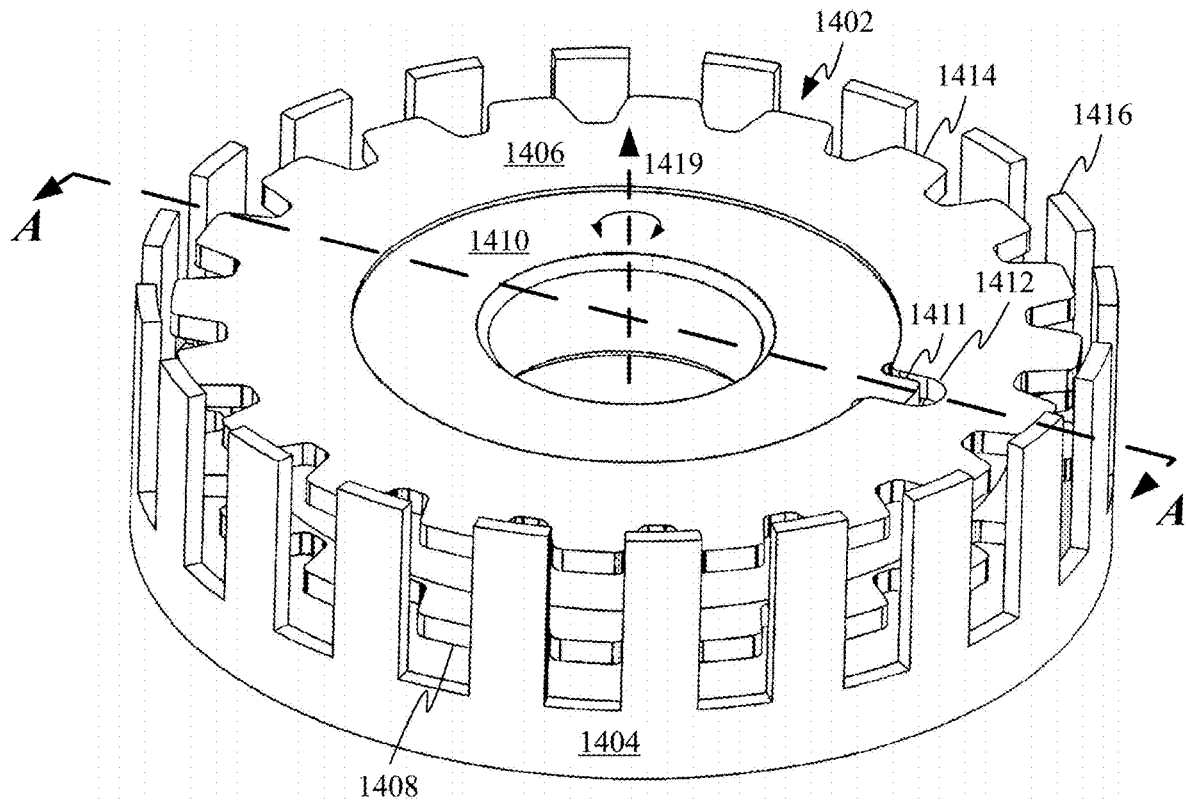
FIGS. 14A-14B show a magnetic ratchet system, according to certain embodiments.
Figure 14B:
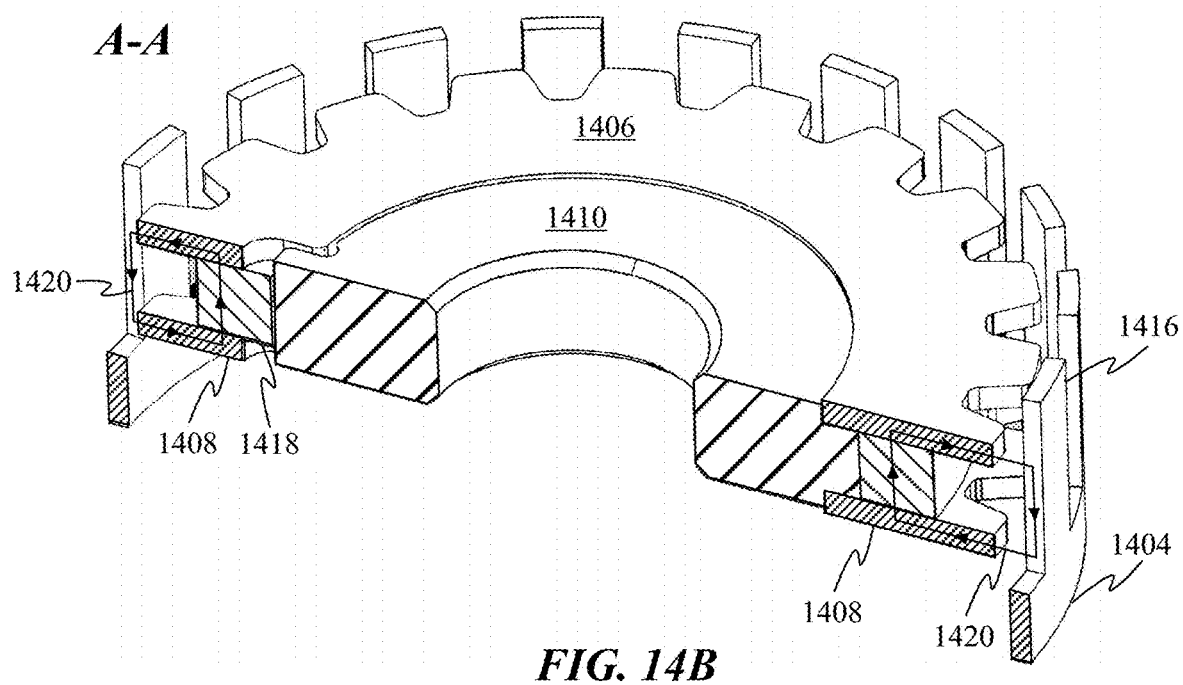

FIGS. 14A-14B show magnetic ratchet system 1400 similar to the system shown in FIG. 6. In particular, FIG. 14A shows a perspective view of ratchet assembly 1402 surrounded by knob armature 1404. Ratchet assembly 1402 includes first teethed armature 1406 and second teethed armature 1408. The first and second teethed armatures can be held in place and aligned with each other by magnetically neutral rim 1410. Magnetically neutral rim 1410 can include protrusion 1411, which engages notches 1412 defined by both the first and second teethed armatures. By engaging notches 1412 with protrusion 1411, the radially protruding teeth of each of armatures 1406 and 1408 can be kept in alignment. As depicted, each tooth 1414 of teethed armatures 1406 and 1408 are distributed radially at a uniform radial interval. In some embodiments, each tooth can be separated by a radial angle of about 9 degrees. In some embodiments different radial angles are possible and can be varied to provide a different feedback profile. For example, different numbers of teeth can be used to achieve greater or smaller travel distances for each ratcheting step. It should be noted that each axially protruding tooth 1416 of knob armature 1404 is distributed about knob armature 1404 at the same radial interval. In this way, when knob armature 1404 rotates about rotational axis 1419 and ratchet assembly 1402 remains stationary, the radially protruding teeth and axially protruding teeth are either simultaneously in alignment or out of alignment.

FIG. 14B shows a cutaway view of magnetic ratchet system 1400 in accordance with section line A-A depicted in FIG. 14A. In particular, FIG. 14B shows how ring magnet 1418 is positioned between first teethed armature 1406 and second teethed armature 1408. In some embodiments, ring magnet 1418 can be a rare earth magnet such as a neodymium magnet. A magnetic field emitted by ring magnet 1418 can follow a magnetic circuit 1420 that travels from ring magnet 1418, through first teethed armature 1406, axially protruding teeth 1416 and second teethed armature 1408. An air gap separating the radially protruding teeth from the axially protruding teeth can be on the order of about 0.5 mm when the teeth are aligned. Because teethed armatures 1406 and 1408 move closer and farther away from axially protruding teeth 1416 during rotation of knob armature 1404 the change in the radial gap size of the magnetic circuits can cause a varying resistive torque that alternatingly opposes and assists rotation of the knob armature, thereby generating ratcheting feedback.

Figure 14C:
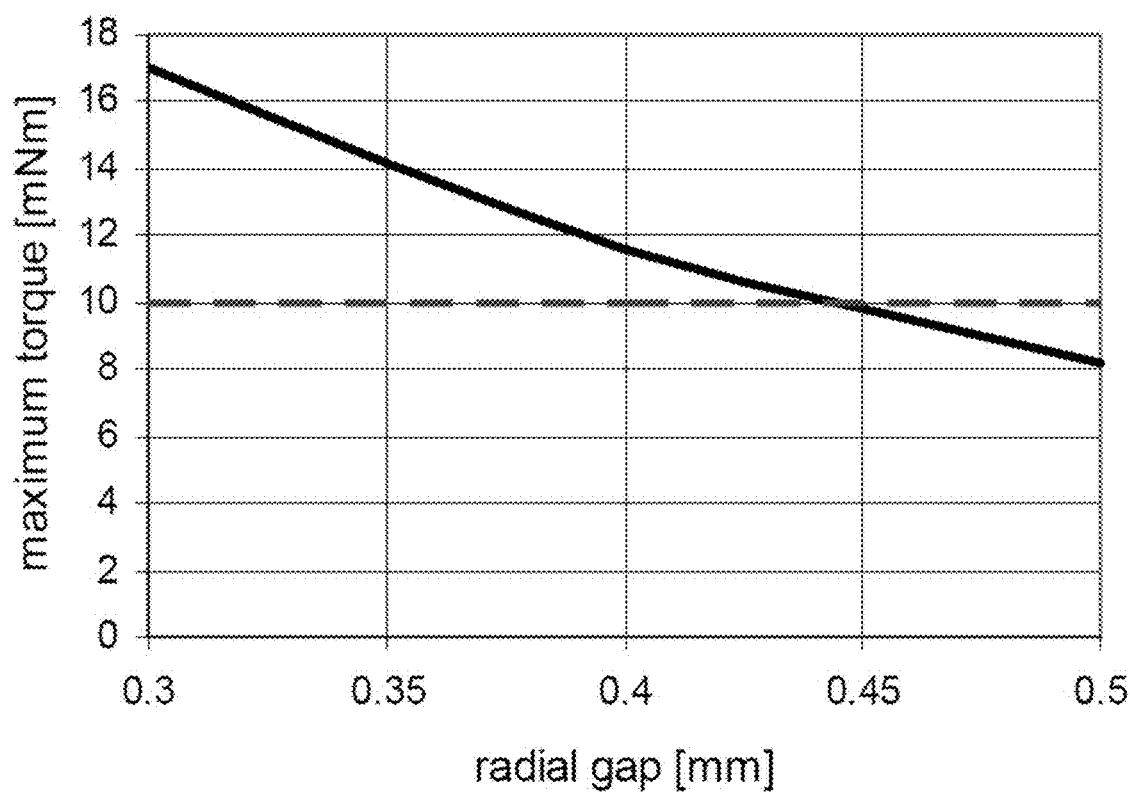
FIG. 14C shows how as the gap between the teeth gets smaller, the amount of resistance provided increases substantially, according to certain embodiments.

FIG. 14C shows how as the gap between the radially protruding teeth and the axially protruding teeth gets smaller, the amount of resistance provided can increase. The maximum resistive force represented by the chart is reached as the axially protruding teeth approach a position half-way between radially protruding teeth 1414. This graph illustrates how when a maximum torque of 10 mNm is desired a gap size of 0.45 mm could be established between the axially protruding teeth and the radially protruding teeth. By incorporating magnetic ratchet system 1400 into an input device, such as an input knob, a user can be provided with a ratcheting feedback. It should be noted that the shape and magnitude of the torque graph can also be dependent on other factors such as the type and grade of permanent magnet used as well as the shape of the magnetic field. For example, some permanent magnets can be magnetized in a manner that causes the magnetic field to have a particular size and/or shape. Consequently, a ring magnet with a more radially biased field could produce more torque than a conventionally magnetized ring magnet. Furthermore, the type of material used to create the ring magnet can have great effect on a resulting magnetic field strength. For example, a neodymium magnet could generate a much stronger magnetic field than a ferrite magnet. For this reason a design utilizing a ferrite magnet would need a smaller gap to generate an equivalent amount of torque as a similarly configured neodymium magnet.

Figure 15A:
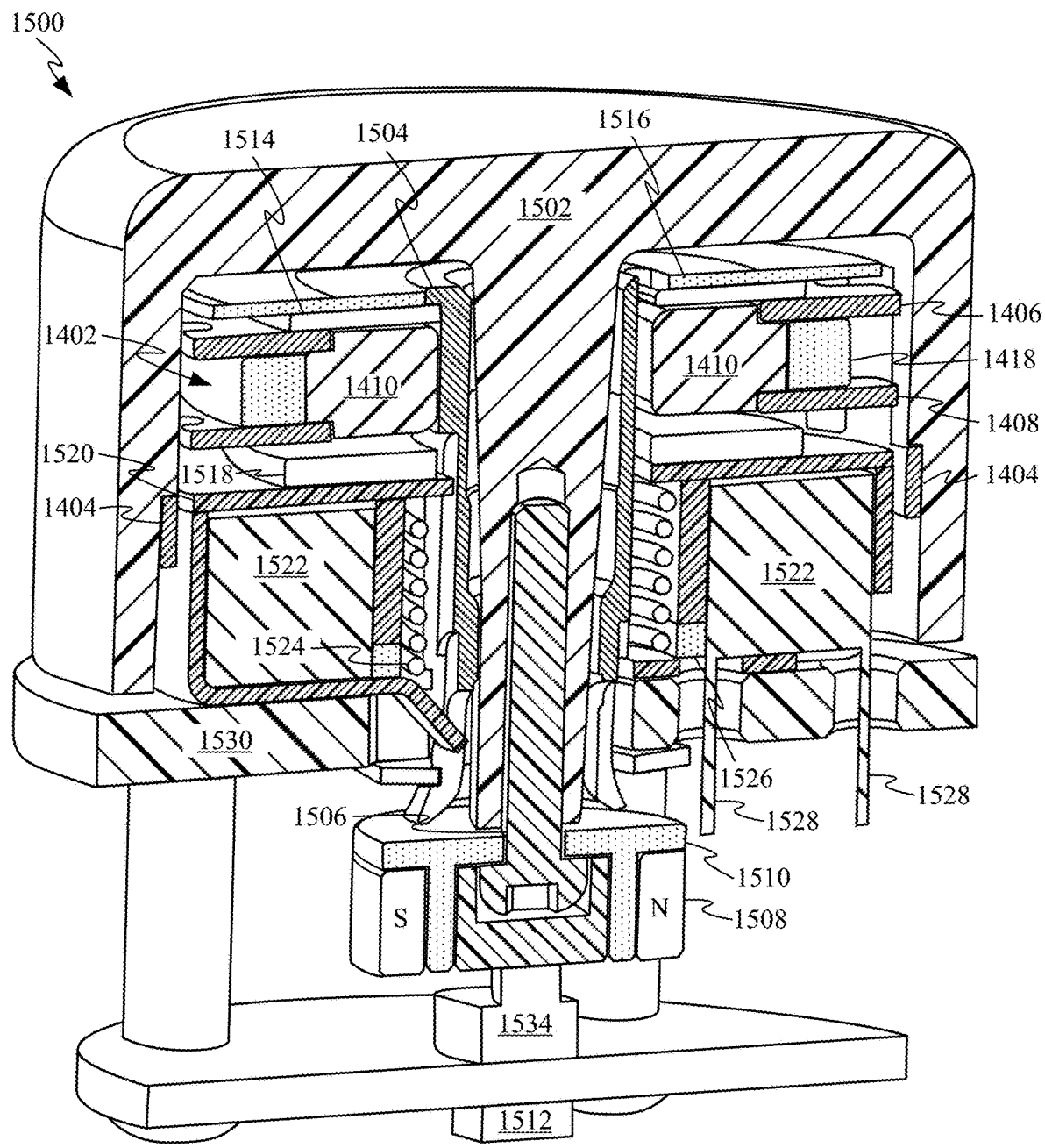
FIG. 15A shows a cutaway view of an input device incorporating the magnetic ratchet system depicted in FIGS. 14A and 14B, according to certain embodiments.

FIG. 15A shows a cutaway view of input device 1500 incorporating magnetic ratchet system 1400 in a non-ratchet mode of operation. Magnetic ratchet system 1400 can be disposed within an annular cavity defined by knob 1502. Knob 1502 includes a top wall, side walls and a central protrusion that all cooperate to define the annular cavity. While an exterior geometry of knob 1502 can be substantially cylindrical other geometries are also possible. For example, knob 1502 can have knurled exterior sidewall surfaces and/or include a protrusion helping a user keep track of a rotational position of knob 1502. The central protrusion of knob 1502 is inserted into a bearing defined by cylindrical support structure 1504. The central protrusion is also engaged by fastener 1506, which couples knob 1502 to sensor magnet 1508. In some embodiments, sensor magnet 1508 can be a ring magnet. In some embodiments, sensor magnet can include a number of alternating polarity magnets arranged radially about magnet support structure 1510. Magnetic field sensor 1512 can take the form of a magnetometer and be configured to detect any rotation of sensor magnet(s) 1508. Sensor readings gathered by magnetic field sensor 1512 can be used to track rotation of knob 1502.

FIG. 15A also shows how magnetic ratchet system 1400 contacts stationary friction disc 1514. Stationary friction disc 1514 can be made of magnetically attractable material and coupled to a bottom facing surface of printed circuit board 1516. A magnetic field emitted by ring magnet 1418 can create a weak magnetic coupling between ratchet assembly 1402 and stationary friction disc 1514. In some embodiments, this magnetic interaction can keep ratchet assembly 1402 from shifting axially within the annular cavity defined by knob 1502. Stationary friction disc 1514 can have a roughness that can be configured to generate only a limited amount of static friction due to the weak magnetic coupling so that the magnitude of the static friction has little effect on the free rotation of ratchet assembly 1402 when input device 1500 is in the non-ratchet mode of operation. Consequently, in the depicted configuration, the magnetic circuits established between teethed armatures 1406 and 1408 and each of the axially protruding teeth of knob armature 1404 generate enough force to rotate ratchet assembly 1402 along with knob 1502. This configuration can be helpful when a user wishes to rotate knob 1502 without any noticeable feedback.

FIG. 15A also shows a clutch mechanism. The clutch mechanism includes a friction disc assembly made up of friction disc 1518 and mobile clutch control armature 1520. The clutch mechanism also includes an electromagnetic actuator made up of electromagnet coil 1522, helical spring 1524 and ring magnet 1526. Electromagnet coil 1522 is configured to receive electricity through leads 1528 that extend through openings defined by support substrate 1530.

Figure 15B:
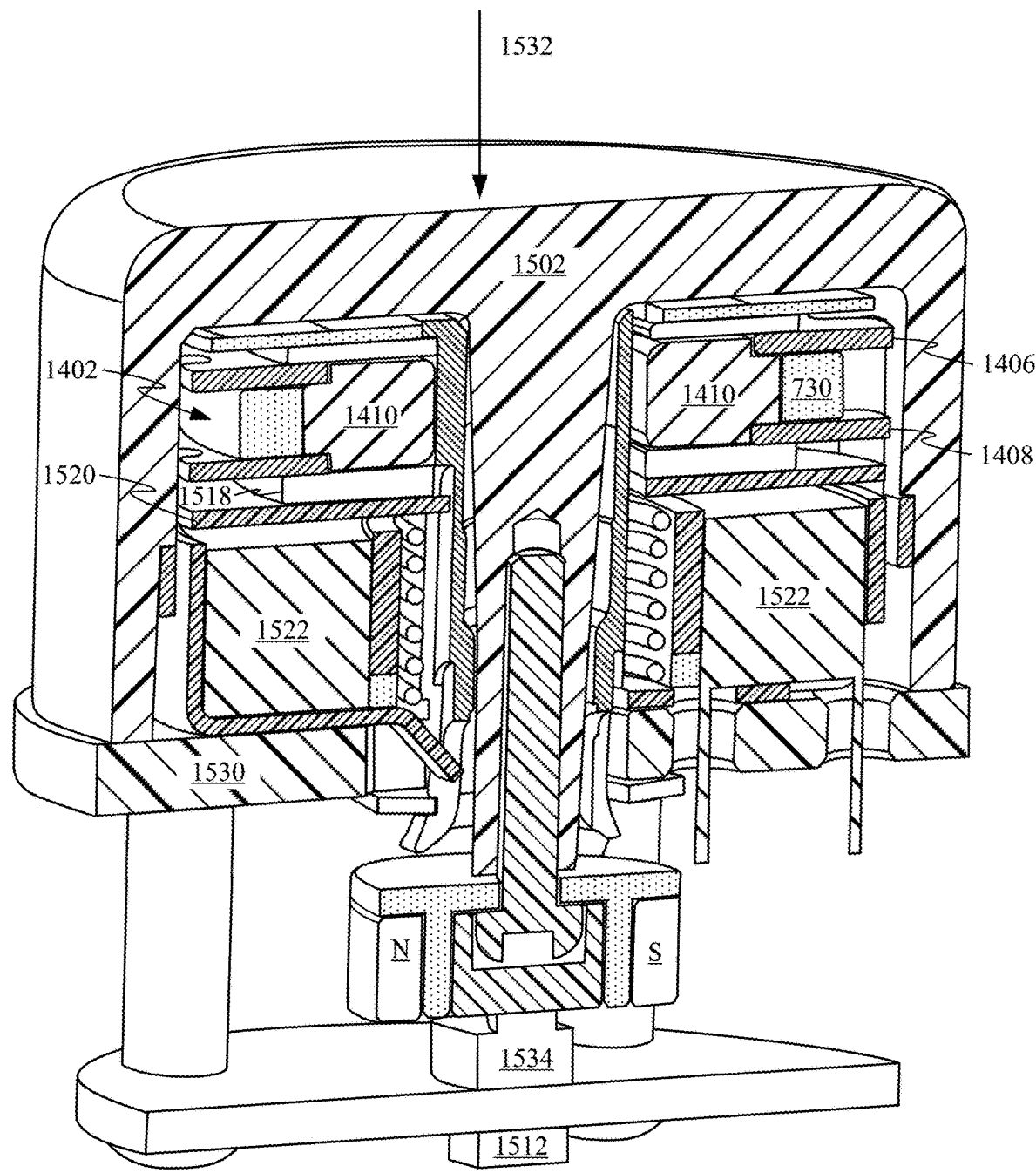
FIG. 15B shows a knob of the input device depicted in FIG. 15A receiving an axial user input, according to certain embodiments.

FIG. 15B shows knob 1502 of input device 1500 receiving an axial user input 1532. Axial user input 1532 received at knob 1502 results in switch 1534 being engaged. In response to being engaged, switch 1534 is configured to send a control signal registering axial user input 1532. In some embodiments, switch 1534 can take the form of a dome switch configured to provide the user a clear indication when switch 1534 is engaged. Switch 1534 can also be configured to return knob 1502 back to the position depicted in FIG. 15A once axial user input 1532 is complete. When comparing FIG. 15B to FIG. 15A it can be seen that motion of knob 1502 is made possible by the additional space at the top of the annular cavity defined by knob 1502 and by the gap between knob 1502 and support substrate 1530. Contact between the rim of knob 1502 and support substrate 1530 can prevent a user from applying too much force to switch 1534. It should be noted that while input device 1500 is depicted in a ratchet mode of operation on account of friction disc 1518 being compressed against ratchet assembly 1402, it should be appreciated that an axial input can be applied and received by switch 1534 when input device 1500 is in a ratchet mode or a non-ratchet mode of operation.

Figure 16A:
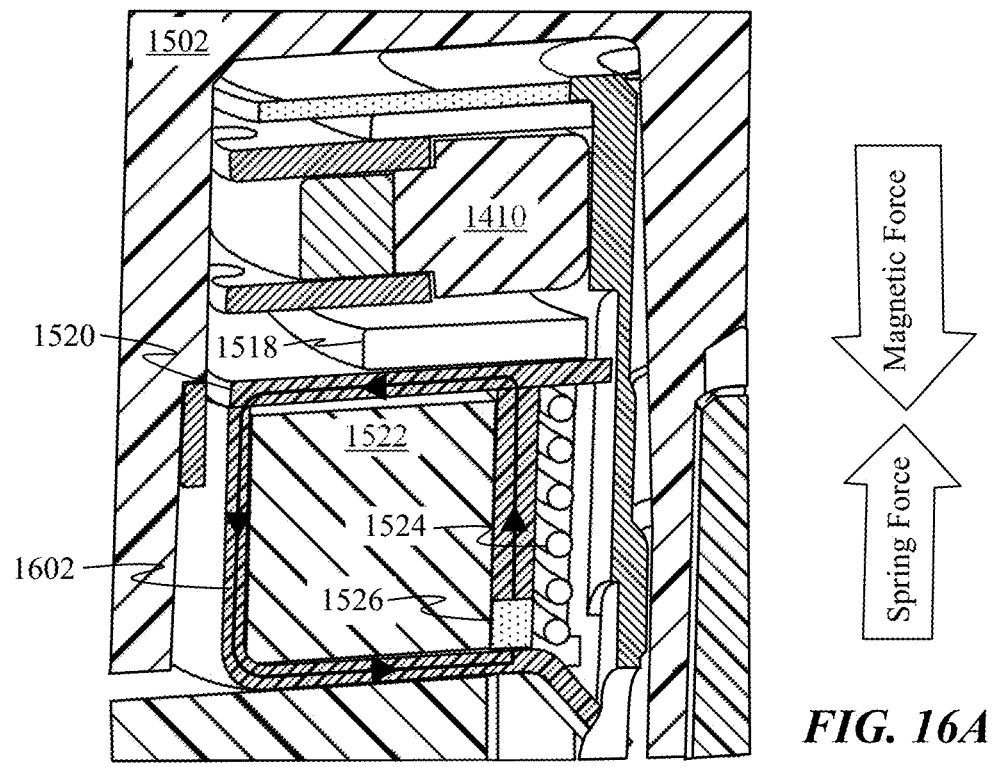
FIGS. 16A-16D show close up views of a portion of the input device of FIG. 15A to depict the operation of a clutch mechanism, according to certain embodiments.

FIGS. 16A-16D show close up views of a portion of input device 1500 to depict the operation of the clutch mechanism. In particular, FIG. 16A shows mobile clutch control armature 1520 and friction disc 1518 in a first position corresponding to a non-ratchet mode of operation of input device 1500. In the first position mobile clutch control armature completes magnetic circuit 1602, which redirects a magnetic field generated by ring magnet 1526 towards mobile clutch control armature 1520. The shift in the magnetic field due to the presence of the complete magnetic circuit and the motion of magnetic flux through mobile clutch control armature 1520 results in the magnetic field generating a magnetic force that is greater than the spring force applied by helical spring 1524. In this way, mobile clutch control armature 1520 can be positioned in the first position and then remain in the first position without any further assistance from electromagnet 1522.

Figure 16B:
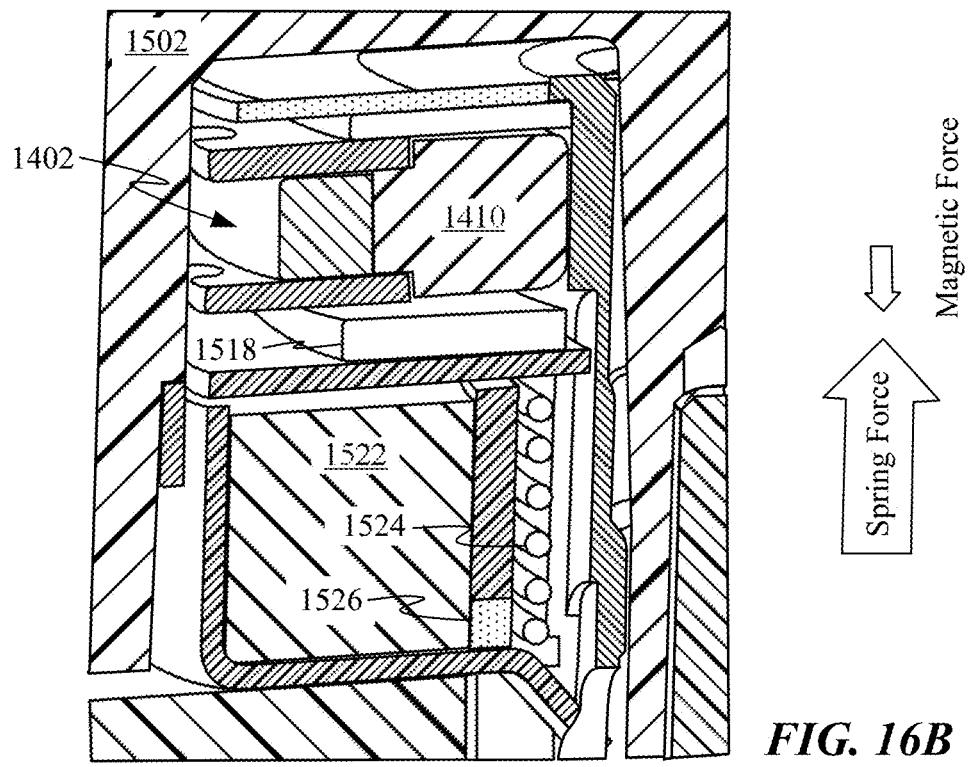

FIG. 16B shows how when current runs through electromagnet coil 1522 in a first direction the resulting flux generated by electromagnet coil 1522 opposes and substantially reduces the strength of the magnetic field generating the force retaining mobile clutch control armature 1520 in the first position. This reduction in magnetic field strength substantially reduces the magnetic force retaining mobile clutch control armature 1520 in place. As depicted, this allows spring 1524 to start moving both mobile clutch control armature 1520 and friction disc 1518 towards a second position where friction disc 1518 is pushed against ratchet assembly 1402.

Figure 16C:
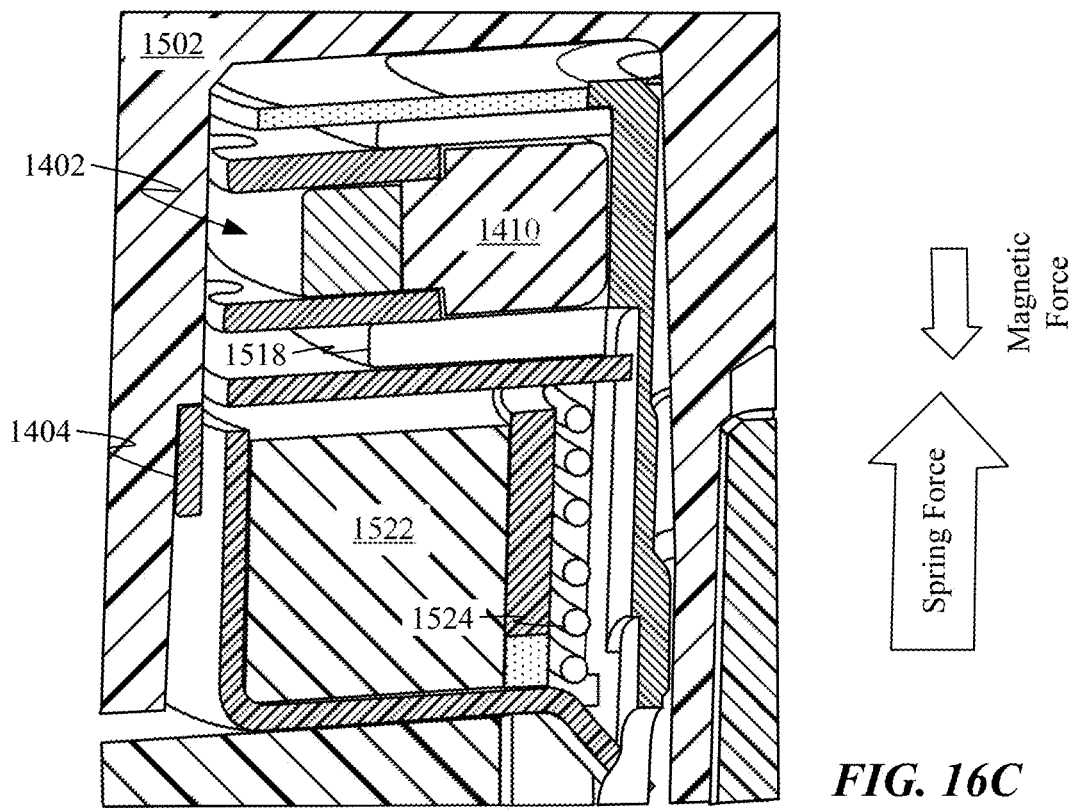

FIG. 16C shows friction disc 1518 after it has arrived in the second position and is contacting ratchet assembly 1402. Force applied by helical spring 1524 pushes a roughened surface of friction disc 1518 against ratchet assembly 1402 in order to generate static friction that opposes rotation of ratchet assembly 1402. This static friction can prevent rotation of ratchet assembly 1402. Relative motion of axially protruding teeth of knob armature 1404 with respect to stationary radially protruding teeth of the teethed armatures then results in ratcheting feedback being provided as knob 1502 is rotated.

Figure 16D:
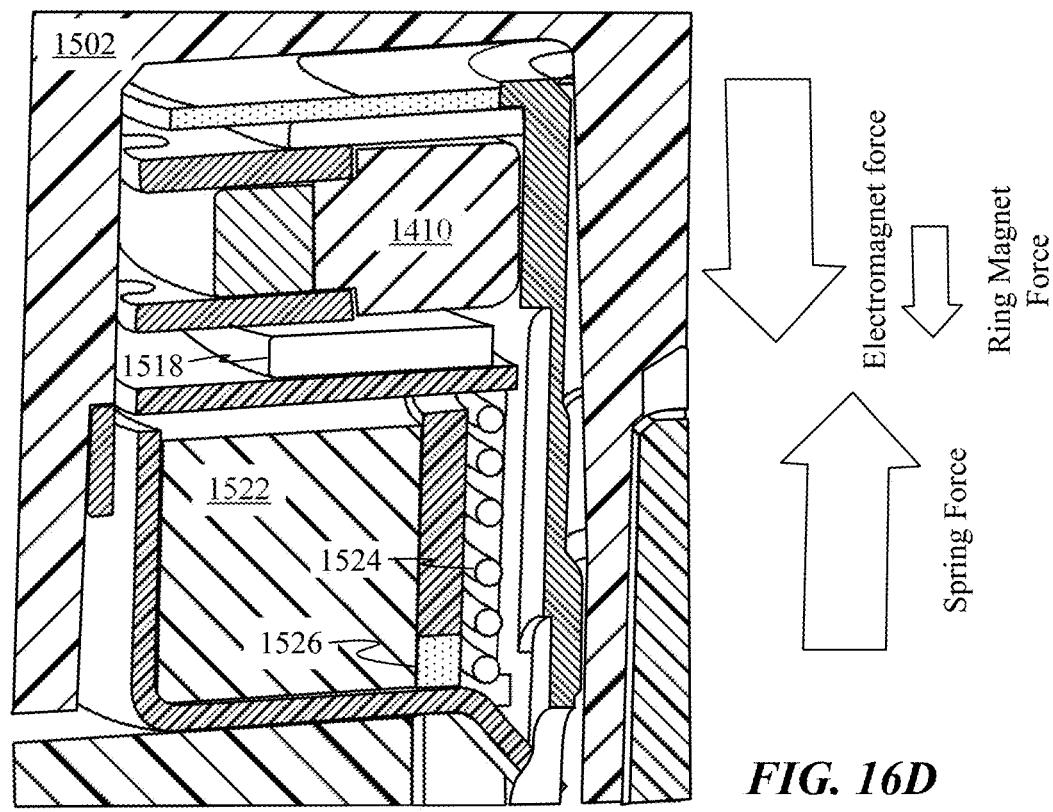

FIG. 16D shows how when electromagnet coil 1522 receives electrical current in a second direction opposite the first direction, an electromagnetic field generated by electromagnet coil 1522 boosts the magnetic field generated by ring magnet 1526. This boost in the magnetic field generates a large enough attractive force on mobile clutch control armature 1520 to overcome the spring force generated by spring 1524. As depicted, mobile clutch control armature 1520 and friction disc 1518 begin moving back towards the first position, thereby putting the input device back into a non-ratchet mode of operation. Once the friction disc assembly returns to the first position (see FIG. 16A) and the magnetic circuit is reestablished, electromagnet 1522 can be disengaged.

Figure 17:
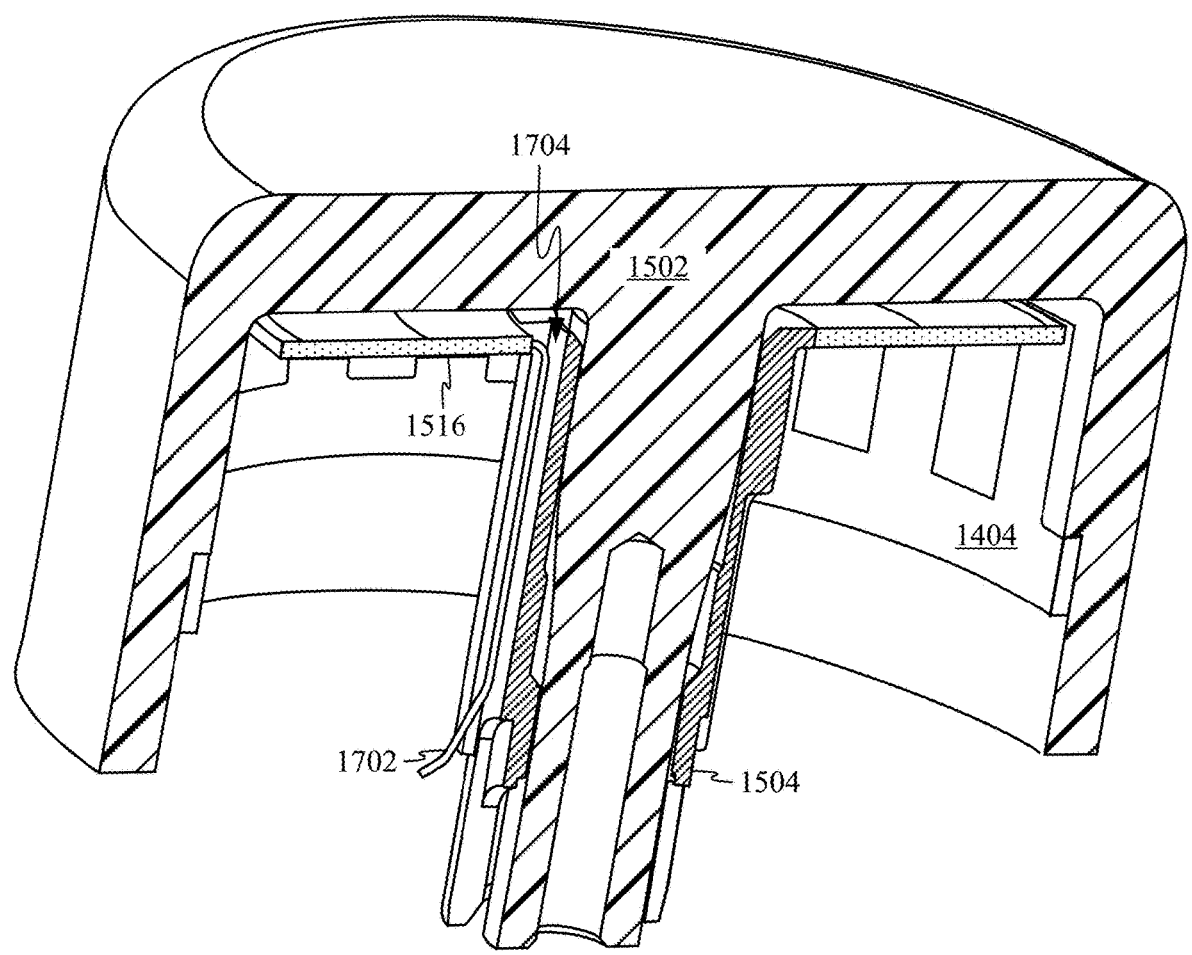
FIG. 17 shows a perspective view of a knob assembly, which includes a knob and a knob armature, according to certain embodiments.

FIG. 17 shows a perspective view of the knob assembly, which includes knob 1502 and knob armature 1404. As depicted, it can be seen how knob armature 1404 is embedded within knob 1502. In some embodiments, knob armature 1404 can be embedded along an interior facing surface of knob 1502 as part of an insert molding process. FIG. 17 also illustrates cylindrical support structure 1504, which as previously discussed defines a bearing for the central protrusion of knob 1502. Cylindrical support structure is also rigidly coupled to printed circuit board 1516, thereby helping position printed circuit board 1516 near an upper end of the annular cavity defined by knob 1502. Cylindrical support structure 1504 also defines wire channel 1704, which provides a path along which wire 1702 can be routed past the ratchet assembly and clutch mechanism that could otherwise block the passage of wire 1702 to electronics positioned in the base of input device 1500.

Description of Second Magnetic Ratchet Embodiment

Figure 18A:
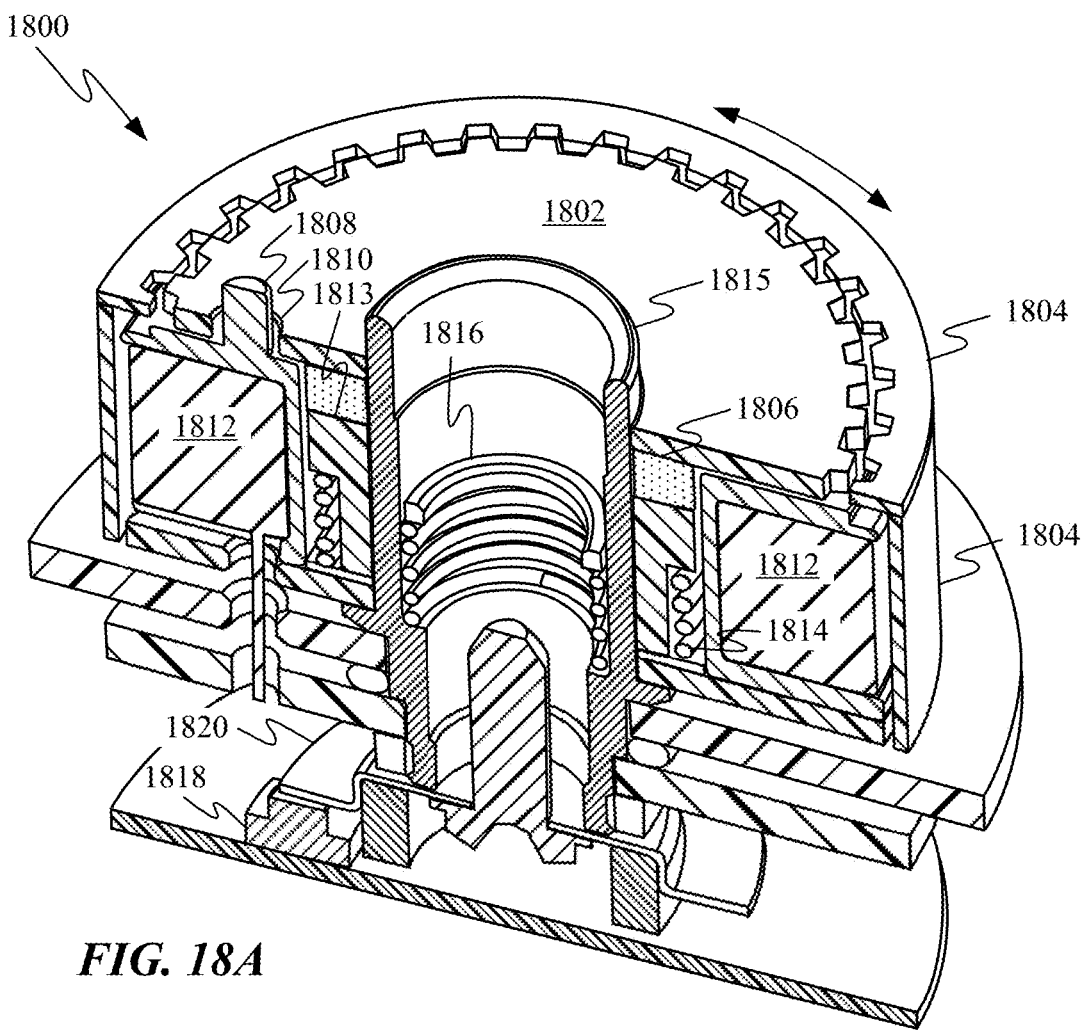
FIGS. 18A-18B show an input device utilizing an alternative magnetic ratchet configuration arranged in a ratchet mode of operation, according to certain embodiments.
Figure 18B:
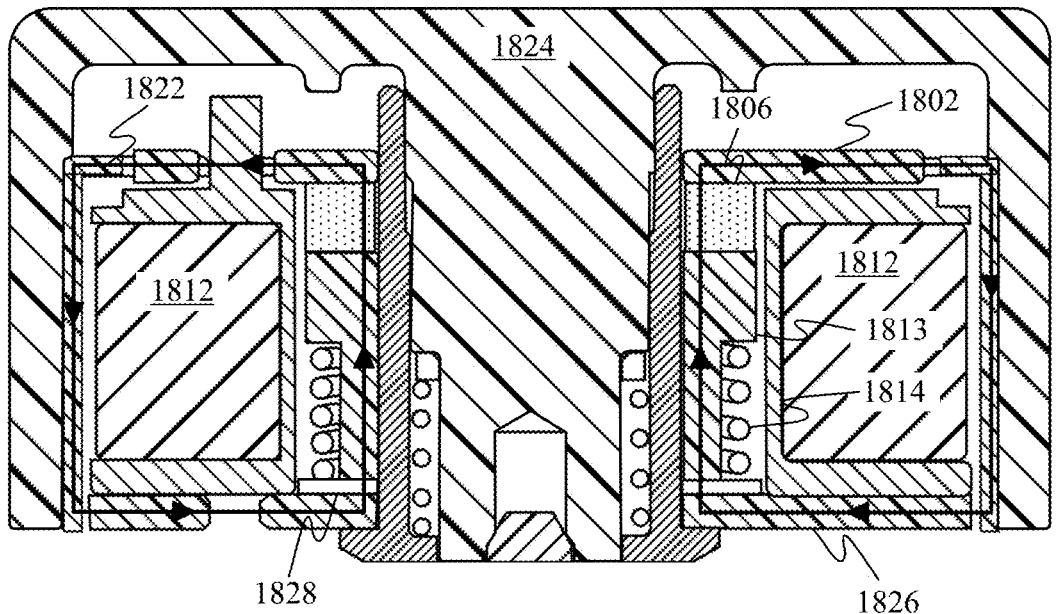

FIGS. 18A-18B show input device 1800 utilizing an alternative magnetic ratchet configuration arranged in a ratchet mode of operation. FIG. 18A shows a cutaway view of input device 1800 with the knob removed in order to show internal details of input device 1800. Teethed armature 1802 is depicted in radial alignment with knob armature 1804. As in the previously described embodiments, knob armature 1804 is coupled to and arranged along an interior facing surface of the knob. When armatures 1802 and 1804 are in radial alignment, movement of knob armature 1804 about teethed armature 1802 generates a magnetically driven ratcheting feedback response. The magnetic feedback is driven by ring magnet 1806, which emits a magnetic field that is channeled along a magnetic circuit in the depicted ratchet mode. The magnetic circuit includes both teethed armature 1802 and knob armature 1804. Teethed armature 1802 is prevented from rotating along with knob armature 1804 by anti-rotation feature 1808, which engages opening 1810 defined by teethed armature 1802.

FIG. 18A also depicts a clutch mechanism that includes electromagnet coil 1812, stepped tube 1813 and spring 1814. To change the input device from the ratchet mode of operation to the non-ratchet mode of operation, electromagnet coil 1812 is energized and generates a magnetic field that repulses magnets 1806. This repulsive force in cooperation with the force exerted by spring 1814 on stepped tube 1813, pushes stepped tube 1813, ring magnet 1806 and teethed armature 1802 in an axial direction so that teethed armature 1802 is out of alignment with knob armature 1804. FIG. 18A depicts cylindrical support structure 1815, which defines a bearing for receiving a portion of the knob. A spring-driven feedback mechanism 1816 is disposed within the bearing defined by cylindrical support structure 1815. Feedback mechanism 1816 provides resistance to an axial user input on the input device and is configured to return the knob of the input device back to its original position prior to the input. Input of the axial user input is transferred to electrical switch 1818 by magnet support structure 1820.

FIG. 18B shows a cross-sectional view of a portion of input device 1800. In particular, FIG. 18B shows a path and direction of magnetic circuits 1822 established by a magnetic field generated by ring magnet 1806. The direction of the flux passing through magnetic circuits 1822 is a function of the polarity of the magnetic field generated by ring magnet 1806. Magnetic circuits 1822 perform two functions in the ratchet mode. First, the magnetic circuits provide a variable resistance to rotation of knob 1824. Second the magnetic circuits increase the attraction force between ring magnet 1806 and magnetically attractable circuit segment 1826. This increased attraction force can be greater than the force applied to ring magnet 1806 by spring 1814. For this reason, input device 1800 is stable in the ratchet mode until ring magnet 1806 is pushed axially upward by spring 1814 as a result of electromagnet coil 1812 being energized, which reduces the retaining force generated by magnetic circuits 1822. In some embodiments, the amount of energy necessary to transition the input device between the ratchet and non-ratchet modes of operation can be tuned by changing the size of air gaps in magnetic circuit 1822. For example, a washer 1828 made of magnetically neutral or non-magnetic material can be positioned between stepped tube 1813 and magnetically attractable circuit segment 1826. As a thickness of washer 1828 is changed the amount of axial force generated by magnetic circuit 1822 also changes, thereby allowing the axial retaining force keeping the input device in the ratchet mode depicted in FIGS. 18A-18B to be fine-tuned. It should be noted that two other air gaps are present in magnetic circuits 1822. As described previously, the air gap between teethed armature 1802 and knob armature 1804 generates the ratchet force. The air gap between knob armature 1804 and magnetically attractable circuit segment 1826 does not generate a noticeable amount of force since the gap size remains uniform during rotation of knob 1824.

Figure 19A:
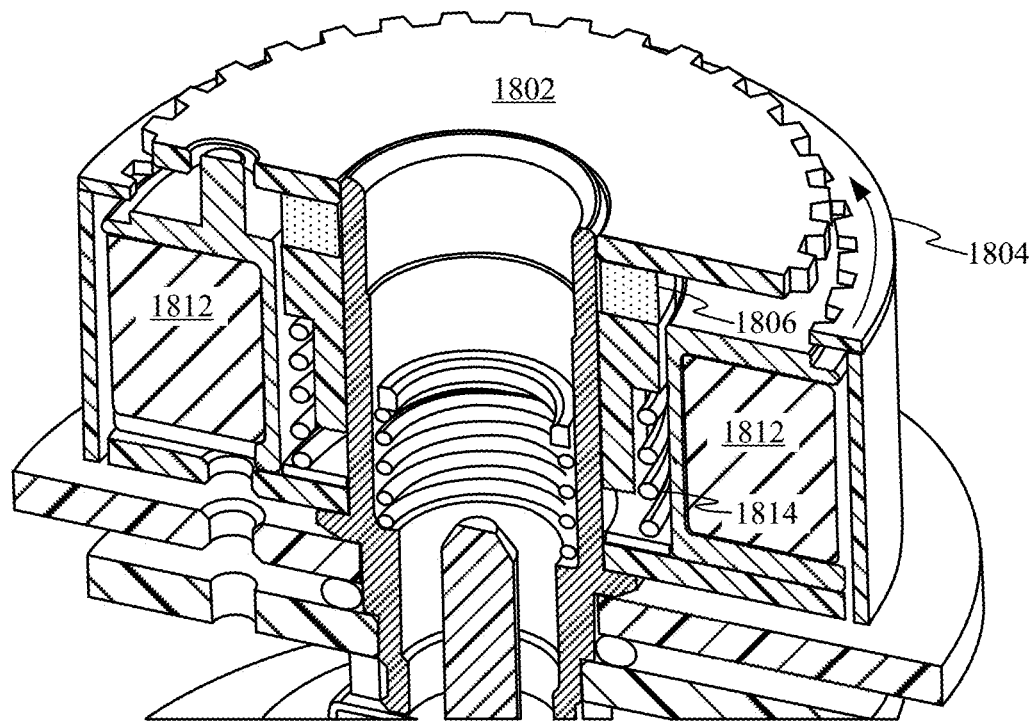
FIGS. 19A-19B show different views of the input device depicted in FIGS. 18A-18B in a non-ratchet mode of operation, according to certain embodiments.
Figure 19B:
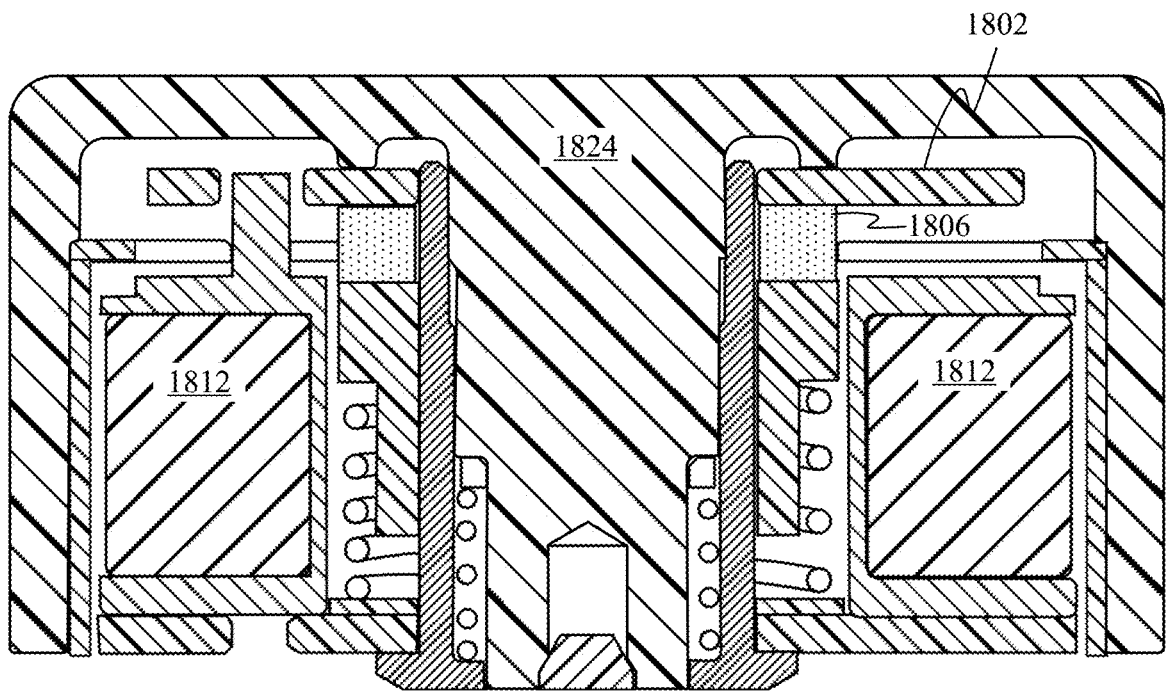

FIGS. 19A-19B show different views of input device 1800 in a non-ratchet mode of operation. In particular, FIG. 19A shows a cutaway view of input device 1800. In particular, FIG. 19A shows how ring magnet 1806 has been pushed up by a force generated by energizing electromagnet coil 1812 in cooperation with a force from spring 1814. This movement breaks the magnetic circuits in two places, significantly reducing the amount of magnetic force opposing spring 1814. Because teethed armature 1802 is now out of alignment with knob armature 1804, input device 1800 is in the non-ratchet mode of operation. Furthermore, due to the broken magnetic circuit the spring force applied by spring 1814 is now sufficient to keep teethed armature 1802 in the non-ratchet position without assistance from the electromagnet.

FIG. 19B also shows the breaks in the magnetic circuit caused by movement of ring magnet 1806 into the non-ratchet position. In some embodiments, electromagnet coil 1812 can be configured to change the amount of resistance experienced by the user when rotating knob 1824 in the non-ratchet mode. By continuing to run current through electromagnet coil 1812 when input device 1800 is in the non-ratchet mode of operation, an amount of friction generated between the interface of teethed armature 1802 and knob 1824 can be increased. While this increase in friction and resistance does require continuous power expenditure, this allows for dynamic modulation in the feedback provided during rotation of 1824. For example, an increased resistance can be desirable as a selector reaches an area where fine adjustments are being made. Similarly, current through electromagnet coil 1812 could be reversed to reduce resistance to rotation of knob 1824. In such a configuration, electromagnet coil 1812 could be de-energized after a predetermined period of time has passed without rotation of knob 1824. It should be noted that in some embodiments, the material and/or surface roughness of teethed armature 1802 can be selected to achieve a desired friction coefficient between teethed armature 1802 and knob 1824.

Figure 20:
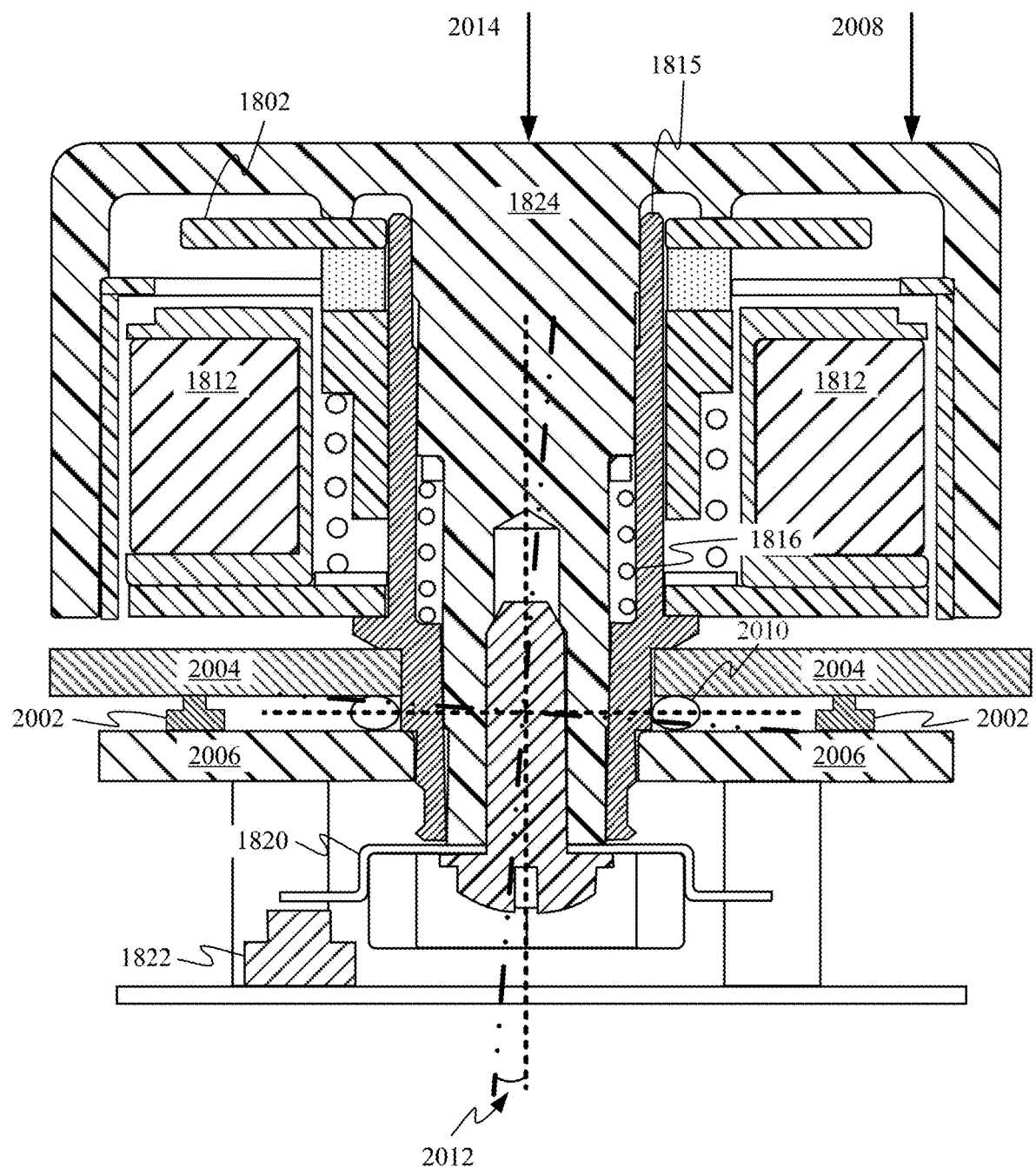
FIG. 20 shows a cross-sectional view of the input device shown in FIGS. 18A-19B that depicts additional input features, according to certain embodiments.

FIG. 20 shows a cross-sectional view of input device 1800 that depicts additional input features. In particular, additional electrical switches 2002 are arranged between first support substrate 2004 and second support substrate 2006. In some embodiments, first support substrate 2004 can represent an outer housing of a keyboard assembly to which input device 1800 is mounted. While only two switches are depicted, at least four switches could be included in order to provide a user the ability to select from four different cardinal directions. In this way, when a force 2008 is applied to a peripheral region of knob 1824, O-ring 2010, which helps maintains the gap between the support substrates and can be formed from a compliant material such as polyurethane, can accommodate tilt of knob 1824 and second support substrate 2006 by angle 2012 to actuate a corresponding one of switches 2002. The switches are actuated by the tilting of substrate 2006 resulting in substrate 2006 pushing one of switches 2002 against a surface of first substrate 2004. When a force 2014 is applied to a central region of knob 1824, feedback mechanism 1816 can transfer only a small amount of force to cylindrical support structure 1815 that is insufficient to inadvertently engage any of electrical switches 2002. In this way, vertical travel of knob 1824 can transfer the vertical travel to magnet support structure 1820, which then can contact electrical switch 1822 in order to electrically register the application of force 2014.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

What is claimed is:

1. An electronic input device, comprising:
   a rotatable knob assembly defining an annular cavity and comprising a magnetically attractable armature;
   a ratchet assembly disposed within the annular cavity and comprising a ring magnet; and
   a clutch mechanism, comprising:
   a friction disc assembly, and
   an electromagnet configured to generate a magnetic field that shifts the friction disc assembly between a first position in which the friction disc assembly engages the ratchet assembly and a second position in which the friction disc assembly is disengaged from the ratchet assembly,
   wherein the ring magnet interacts with the magnetically attractable armature to generate a ratcheting feedback in response to rotation of the knob assembly when the friction disc assembly is in the first position, and
   wherein a ratcheting feedback is not generated in response to rotation of the knob assembly when the friction disc assembly is in the second position.

2. The electronic input device as recited in claim 1, wherein the magnetically attractable armature comprises a plurality of axially protruding teeth that interact with radially protruding teeth of the ratchet assembly to generate the ratcheting feedback.

3. The electronic input device as recited in claim 1, wherein the magnetic field emitted by the electromagnet is a first magnetic field and the ring magnet is a first ring magnet wherein the clutch mechanism further comprises a second ring magnet that emits a second magnetic field and wherein the friction disc assembly is configured to complete a magnetic circuit when the friction disc assembly is in the second position that shifts the second magnetic field towards the ratchet assembly.

4. The electronic input device as recited in claim 1, wherein the clutch mechanism comprises a spring that biases the friction disc assembly towards the first position.

5. The electronic input device as recited in claim 4, wherein when the friction disc assembly is engaging the ratchet assembly in the first position the spring pushes the friction disc assembly against the ratchet assembly to oppose rotation of the ratchet assembly when the knob assembly is rotated.

6. The electronic input device of claim 1 wherein the electronic input device is a keyboard device.

7. A keyboard comprising:
   a ratchet assembly, comprising:
   a first armature having a first plurality of radially protruding teeth,
   a second armature having a second plurality of radially protruding teeth, the first plurality of teeth being aligned with the second plurality of teeth, and
   a ring magnet disposed between the first armature and the second armature and emitting a magnetic field; and
   a rotatable knob assembly, comprising:
   a knob enclosing the ratchet assembly within an annular cavity, and
   an armature ring coupled to an interior facing surface of the knob and including a plurality of axially protruding teeth, the magnetic field establishing magnetic circuits that flow through the first and second armatures and each of the axially protruding teeth,
   wherein magnetic flux flowing through the magnetic circuits generates resistance to rotation of the knob assembly.

8. The keyboard as recited in claim 7, wherein the resistance to rotation of the knob assembly is caused by a changing distance between the axially protruding teeth and the radially protruding teeth.

9. The keyboard as recited in claim 7, wherein the axially protruding teeth are arranged at the same radial interval as the radially protruding teeth of the first and second armatures.

10. The keyboard as recited in claim 7, further comprising:
    a sensor magnet coupled to the knob and emitting a sensor magnetic field;

a magnetic sensor proximate the sensor magnet, the magnetic sensor being configured to detect the rotation of the sensor magnetic field; and a processor configured to translate the detected rotation of the sensor magnetic field into an electrical signal representative of an amount of rotation of the knob.

11. The keyboard as recited in claim 7, further comprising a clutch mechanism configured to remove the varying amount of resistance by allowing the ratchet assembly to rotate with the knob assembly.

12. The keyboard as recited in claim 11, wherein the clutch mechanism comprises a friction disc configured to oppose rotation of the ratchet assembly.

13. The keyboard as recited in claim 12, further comprising a touch sensor disposed within the knob and configured to receive touch input along at least one of a top surface of the knob and lateral surfaces of the knob.

* * * * *